(12) United States Patent
Jung

(10) Patent No.: US 9,640,241 B2
(45) Date of Patent: May 2, 2017

(54) MEMORY DEVICE

(71) Applicant: SK hynix Inc., Icheon-si, Gyeonggi-do (KR)

(72) Inventor: Chul-Moon Jung, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/835,419

(22) Filed: Aug. 25, 2015

(65) Prior Publication Data

US 2016/0351248 A1 Dec. 1, 2016

(30) Foreign Application Priority Data

May 26, 2015 (KR) .......................... 10-2015-0072853

(51) Int. Cl.
| | | |
|---|---|---|
| *G11C 11/406* | (2006.01) | |
| *G11C 11/408* | (2006.01) | |
| *G11C 29/00* | (2006.01) | |
| *G11C 8/12* | (2006.01) | |

(52) U.S. Cl.
CPC .......... *G11C 11/40618* (2013.01); *G11C 8/12* (2013.01); *G11C 11/408* (2013.01); *G11C 11/4085* (2013.01); *G11C 11/4087* (2013.01); *G11C 11/40611* (2013.01); *G11C 29/76* (2013.01); *G11C 29/783* (2013.01)

(58) Field of Classification Search
None
See application file for complete search history.

(56) References Cited

U.S. PATENT DOCUMENTS

| 6,104,664 A * | 8/2000 | Ohno .................. G11C 7/1018 326/105 |
| 9,311,984 B1 * | 4/2016 | Hong .................. G11C 11/406 |
| 2014/0177370 A1 | 6/2014 | Halbert et al. |
| 2016/0019944 A1 * | 1/2016 | Jung .................. G11C 29/76 365/200 |

FOREIGN PATENT DOCUMENTS

| KR | 1020140070303 A | 6/2014 |
| KR | 1020140029018 A | 10/2014 |
| KR | 1020140070304 A | 10/2014 |

* cited by examiner

*Primary Examiner* — R Lance Reidlinger
(74) *Attorney, Agent, or Firm* — William Park & Associates Ltd.

(57) ABSTRACT

A memory device includes a plurality of banks suitable for including a plurality of word lines, a plurality of latch units each suitable for generating a first address by inverting a predetermined bit of an address of an activated word line of a corresponding bank and latching the first address as a target address in sections other than a target refresh section, and latching an operation address as the target address once in an all-bank refresh section of the target refresh section, wherein all of the plurality of banks are refreshed in the all-bank refresh section. All the plurality of banks are refreshed in the all-bank refresh section, and an address operation unit suitable for generating the operation address by adding or subtracting an operation value to or from the target address. A word line among the plurality of word lines that is selected using the target address may be refreshed in the target refresh section.

35 Claims, 16 Drawing Sheets

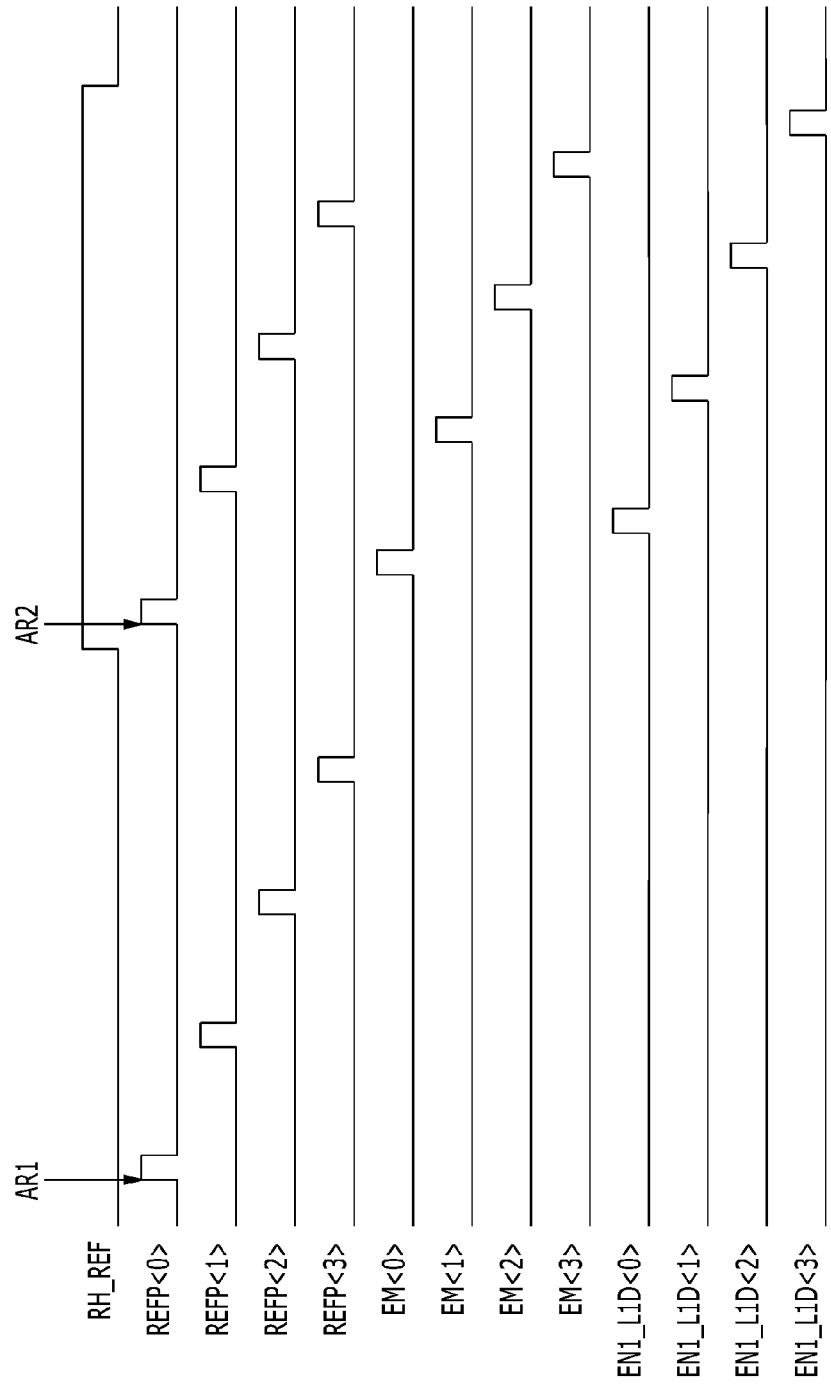

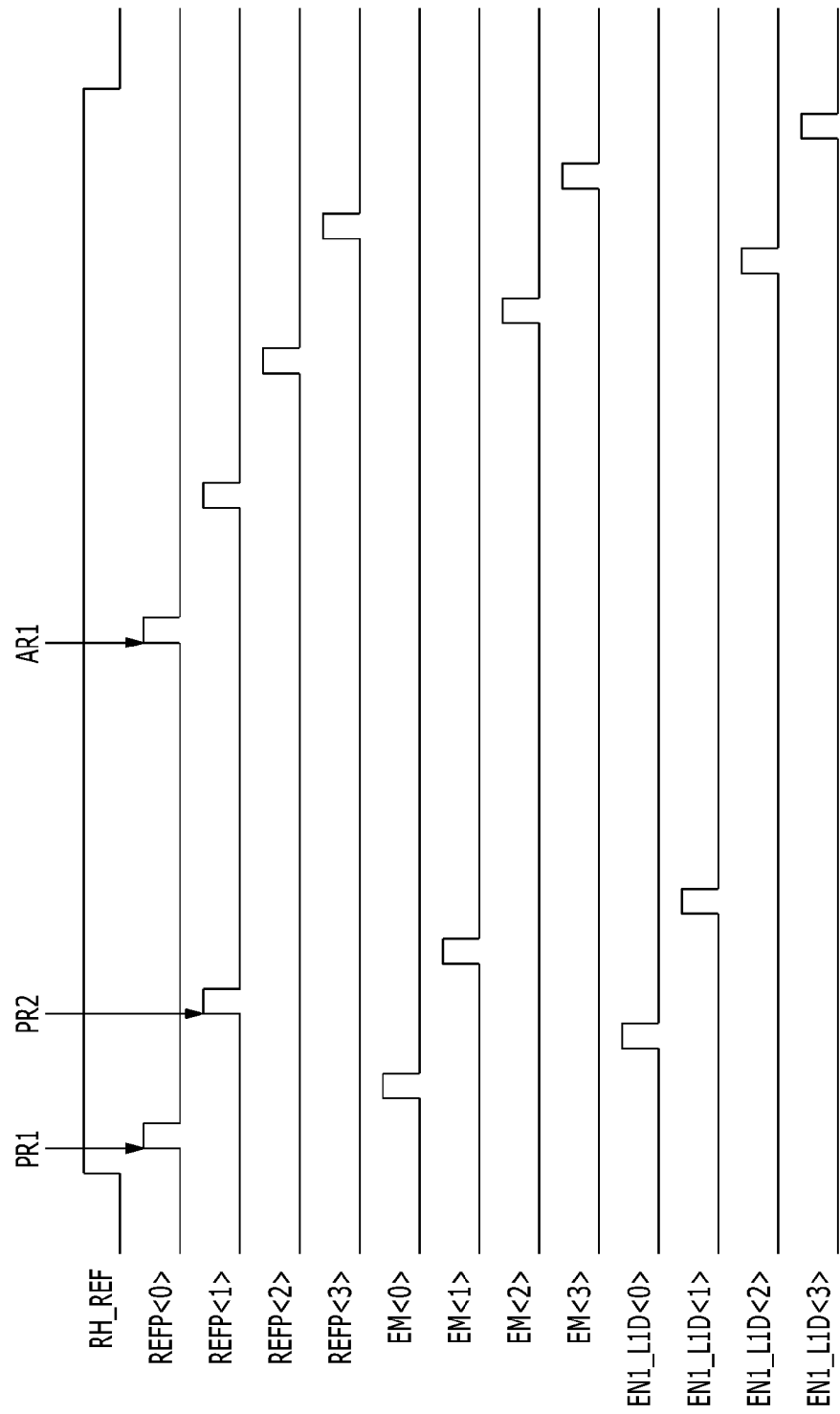

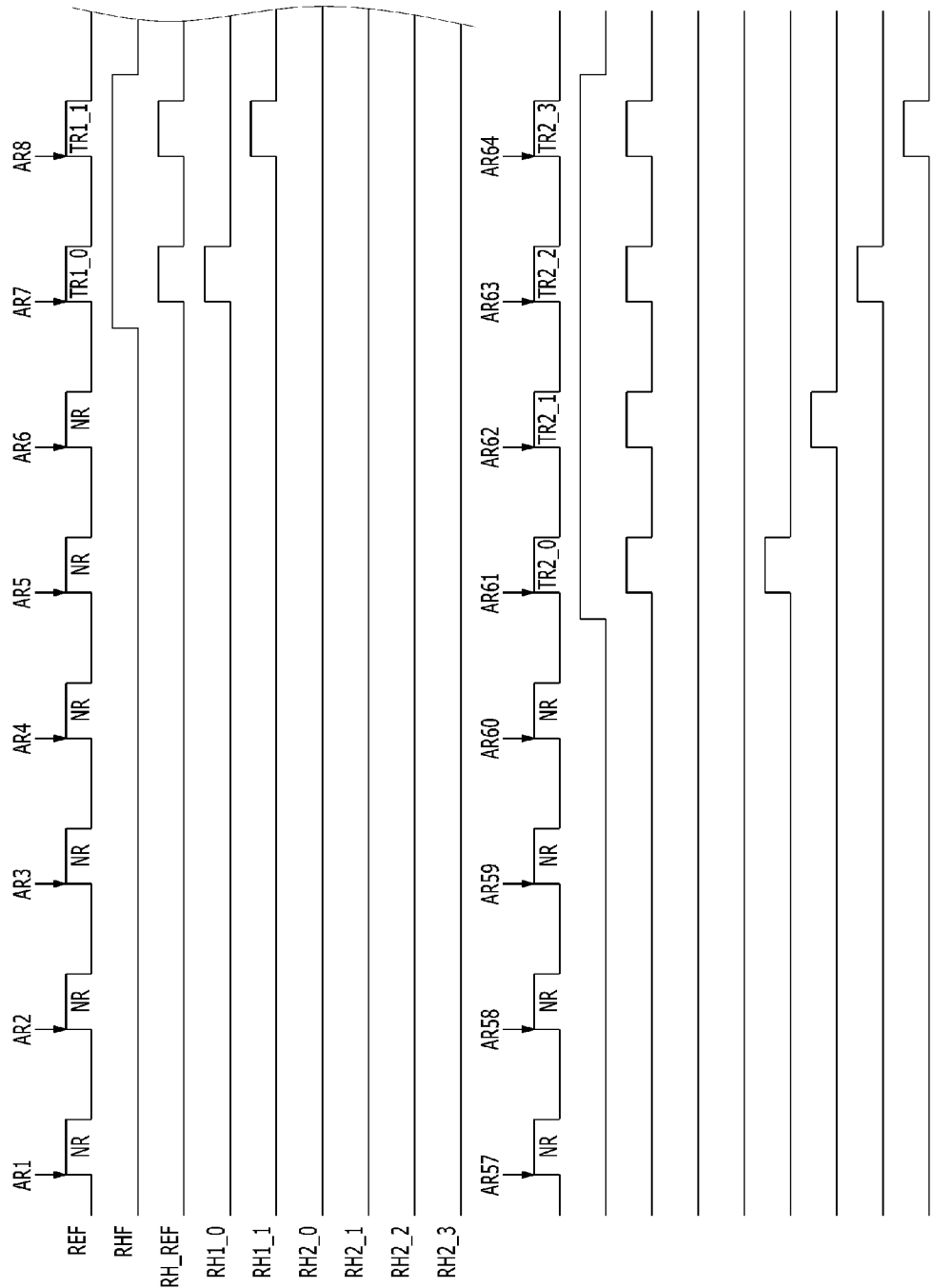

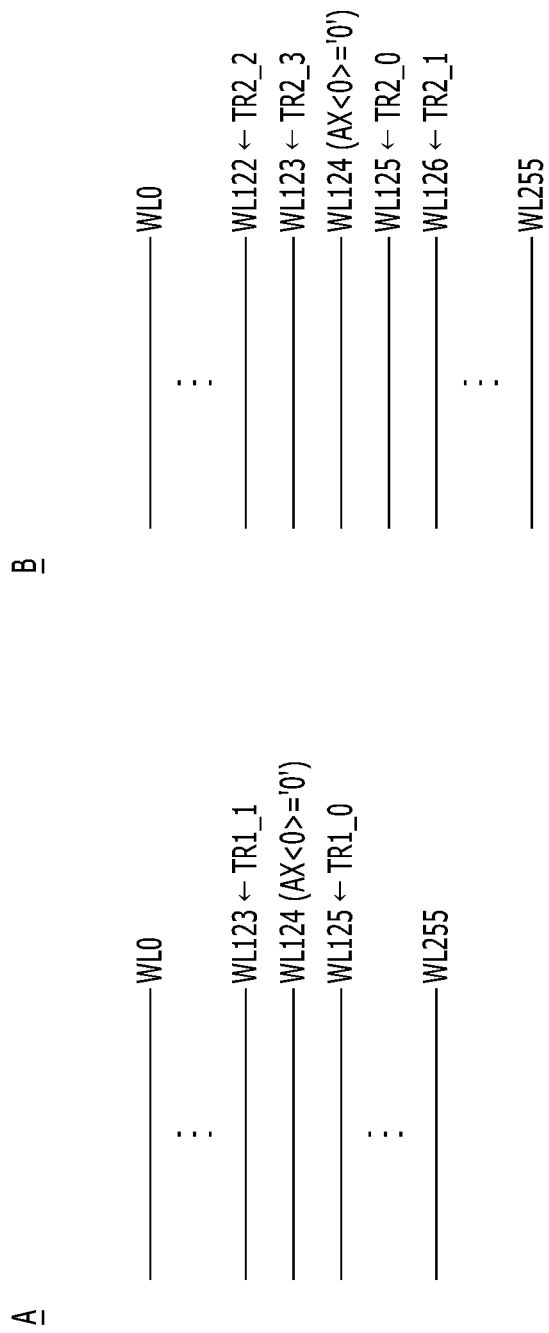

MEMORY DEVICE

CROSS-REFERENCE TO RELATED APPLICATIONS

The present application claims priority of Korean Patent Application No. 10-2015-0072853, filed on May 26, 2015, which is incorporated herein by reference in its entirety.

BACKGROUND

1. Field

Embodiments of the invention relate to a memory device.

2. Description of the Related Art

A memory cell of a memory device includes a transistor functioning as a switch and a capacitor storing charges (or data). "High" (logic 1) or "low" (logic 0) of data is determined depending on whether a charge is present in the capacitor of a memory cell, that is, depending on whether a voltage at the terminal of the capacitor is high or low.

The retention of data basically has no consumption of power because the data is retained in such a manner that charges have been accumulated in the capacitor. However, data may be lost because the amount of charges initially stored in the capacitor becomes extinct in the leakage current attributable to the PN junction of an MOS transistor. In order to prevent such a problem, data within a memory cell needs to be read before the data is lost, and the normal amount of charges needs to be recharged based on the read information. When such an operation is periodically repeated, the memory of data is retained. Such a recharging process of cell charges is called a refresh operation.

Data stored in memory cells may be damaged because the electrons of the cell capacitors included in the memory cells coupled to the adjacent word lines are introduced/drained by electromagnetic waves generated when the word line is toggled in the active state and the precharge state.

SUMMARY

In an embodiment, a memory device may include a plurality of banks suitable for including a plurality of word lines. The memory device may also include a plurality of latch units each suitable for generating a first address by inverting a predetermined bit of an address of an activated word line of a corresponding bank and latching the first address as a target address in sections other than a target refresh section. The plurality of latch units may also be suitable for latching an operation address as the target address once in an all-bank refresh section of the target refresh section, wherein all of the plurality of banks are refreshed in the all-bank refresh section. The memory device may also include an address operation unit suitable for generating the operation address by adding or subtracting an operation value to or from the target address. A word line among the plurality of word lines that is selected using the target address may be refreshed in the target refresh section.

In an embodiment, a memory device may include a plurality of banks suitable for including a plurality of word lines and a plurality of redundancy word lines. The memory device may also include a plurality of first latch units suitable for generating a first address by inverting a predetermined bit of an address of an activated word line of a corresponding bank and latching the first address in sections other than a target refresh section, and latching an operation address as a target address in the target refresh section. The memory device may also include a plurality of second latch units suitable for latching whether a word line among the plurality of wordlines corresponding to the target address of a first refresh operation in the target refresh section and the target address of the first refresh operation has been repaired. The memory device may also include an address operation unit suitable for generating the operation address by adding or subtracting an operation value to or from the target address. (K−1) and (K+2)-th word lines or (K−2), (K−1), (K+1), and (K+2)-th word lines are refreshed using the target address and information latched in the second latch unit if the activated word line is a K-th word line in the sections other than the target refresh section. Further, (L−1) and (L+1)-th redundancy word lines or (L−2), (L−1), (L+1), and (L+2)-th redundancy word lines are refreshed using the target address and the information if the activated word line is an L-th redundancy word line in the sections other than the target refresh section.

In an embodiment, a memory device may include a plurality of banks suitable for comprising a plurality of word lines and a plurality of redundancy word lines. The memory device may also include a plurality of first latch units suitable for generating a first address by inverting a predetermined bit of an address of an activated word line of a corresponding bank and latching the first address as a target address in sections other than a target refresh section, and latching an operation address as the target address once in each all-bank refresh section of the target refresh section, wherein all the plurality of banks are refreshed in the all-bank refresh section. The memory device may also include a plurality of second latch units suitable for latching whether a word line among the plurality of word lines corresponding to the target address of a first refresh operation in the target refresh section and the target address of the first refresh operation has been repaired. The memory device may also include an address operation unit suitable for generating the operation address by adding or subtracting an operation value to or from the target address, wherein (K−1) and (K+2)-th word lines or (K−2), (K−1), (K+1); and (K+2)-th word lines are refreshed using the target address and information latched in the second latch unit if the activated word line is a K-th word line in the sections other than the target refresh section; and (L−1) and (L+1)-th redundancy word lines or (L−2), (L−1), (L+1); and (L+2)-th redundancy word lines are refreshed using the target address and the information if the activated word line is an L-th redundancy word line in the sections other than the target refresh section.

BRIEF DESCRIPTION OF THE DRAWINGS

FIGS. 4a to 4c are diagrams illustrating the operation of a second control signal generation unit 312 when a target refresh operation is performed.

FIG. 5 is a diagram illustrating the refresh operation of the memory device of FIG. 1.

FIGS. 6a and 6b are diagrams illustrating the target refresh operation of the memory device of FIG. 1.

DETAILED DESCRIPTION

Figure 1:
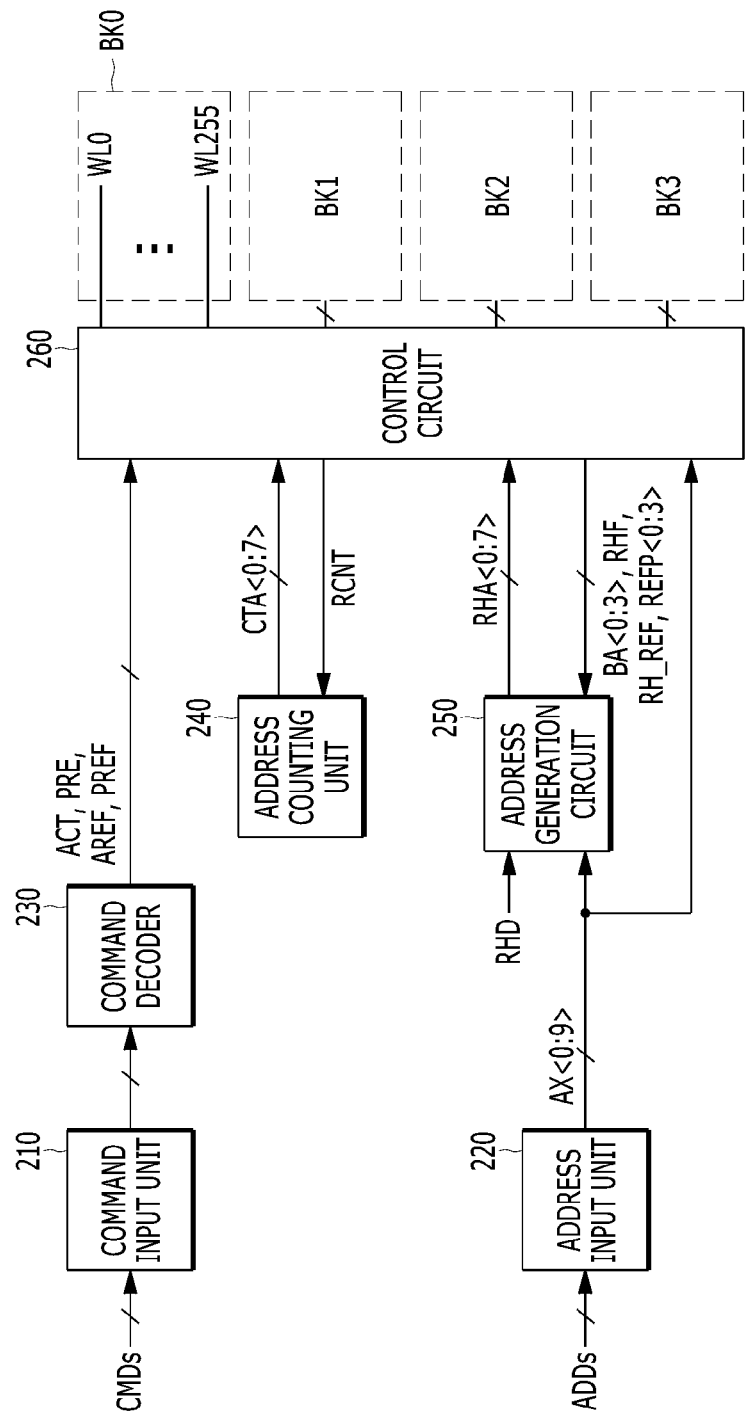
FIG. 1 is a diagram illustrating the configuration of a memory device in accordance with an embodiment of the invention.

Various embodiments will be described below in more detail with reference to the accompanying figures. The invention may, however, be embodied in different forms and should not be construed as limited to the embodiments set forth herein. Rather, these embodiments are provided so that this disclosure will be thorough and complete, and will fully convey the scope of the invention to those skilled in the art. Throughout the disclosure, like reference numerals refer to like parts throughout the various figures and embodiments of the invention. Various embodiments are directed to a memory device capable of generating a target address having a proper value. In addition, various embodiments are directed to a memory device capable of preventing the data of a memory cell from being deteriorated due to a word line disturbance.

Referring to FIG. 1, a diagram illustrating the configuration of a memory device in accordance with an embodiment of the invention is described.

In FIG. 1, the memory device may include a command input unit 210, an address input unit 220, a command decoder 230, an address counting unit 240, an address generation circuit 250, a control circuit 260, and a plurality of banks BK0-BK3.

Hereinafter, a normal refresh operation may be an operation for refreshing a selected word line using a counting address CA<0:7>. Further, a target refresh operation may be an operation for refreshing a selected word line using a target address RHA<0:7>. A detected word line is a word line activated right before the memory device enters a target refresh section and may be a word line, that is, a base for selecting a word line on which a target refresh operation is to be performed. If a detected word line is a K-th word line, a first target refresh operation may be a refresh operation for refreshing (K−1) and (K+2)-th word lines in the target refresh section. In addition, a second target refresh operation may be an operation for refreshing (K−2), (K−1), (K+1), and (K+2)-th word lines in the target refresh section.

The plurality of banks BK0-BK3 may include a plurality of word lines WL0-WL255 electrically coupled to a plurality of memory cells MC. The plurality of word lines WL0-WL255 may be disposed in order of "WL0"-"WL255." FIG. 1 illustrates only the word line and memory cell of "BK0" for convenience of an illustration.

The command input unit 210 may receive commands CMDs, and the address input unit 220 may receive addresses ADDs. Each of the command CMDs and the address ADDs may include of signals of multi-bits.

The command decoder 230 may generate an active command ACT, an all-bank refresh command AREF, a per-bank refresh command PREF, and a precharge command PRE by decoding the command signals CMDs received through the command input unit 210. The command decoder 230 may activate a command that belongs to the commands ACT, AREF, PREF, and PRE and that is indicated by a combination of received command signals CMDs. For reference, the command decoder 230 may also generate a command, such as a read or write command, by decoding received command signals CMDs. For reference, the per-bank refresh command PREF may be a command for selecting one of the plurality of banks BK0-BK3 and refreshing the selected bank. Further, the all-bank refresh command AREF may be a command for refreshing all the plurality of banks.

The address counting unit 240 may generate the counting address CA<0:7> by performing counting whenever all the plurality of banks BK0-BK3 are refreshed. The address counting unit 240 may increase the value of the counting address CA<0:7> by 1 whenever a counting value RCNT is activated. To increase the value of the counting address CA<0:7> by 1 may mean that the counting address CA<0:7> is changed so that a (K+1)-th word line is selected next time if a K-th word line has been selected this time.

The counting value RCNT may be activated once whenever the all-bank refresh section is completed. The all-bank refresh section may be any one of (1) the section in which the per-bank refresh command PREF is consecutively inputted by a number (e.g., 4 times) corresponding to the number of banks BK0-BK3 and all the banks BK0-BK3 are refreshed; (2) the section in which the all-bank refresh command AREF is inputted and all the banks BK0-BK3 are refreshed; (3) the section in which some of the banks are refreshed in response to the per-bank refresh command PREF if the all-bank refresh command AREF has been inputted before the per-bank refresh command PREF is consecutively inputted by a number corresponding to the number of banks BK0-BK3; and (4) the section in which all the banks BK0-BK3 are refreshed in response to the all-bank refresh command AREF.

The address generation circuit 250 may generate the target address RHA<0:7> in a target refresh section. When the bank active signal BA<0:3> is activated in the section in which the detection signal RHD has been activated, the address generation circuit 250 may latch the least significant bit (e.g., AX<0>) of the address AX<0:9> by inverting the least significant bit (e.g., AX<0>). For example, if the address AX<0:9> of a detected word line is "11001010," the address generation circuit 250 may latch "11001011." The address generation circuit 250 may not latch the address AX<0:7> in the section in which the detection signal RHD has been deactivated.

If a detected word line is the K-th word line when a first target refresh operation is performed and the least significant bit of the address of the detected word line is "0" (or "1"), the address generation circuit 250 may generate a target address corresponding to the (K+1 (or K−1))-th word line when the first refresh operation of a target refresh section is performed. The address generation circuit 250 may also generate a target address corresponding to the (K−1 (or K+1))-th word line when the second refresh operation of the target refresh section is performed.

If a detected word line is the K-th word line when a second target refresh operation is performed and the least significant bit of the address of the detected word line is "0" (or "1"), the address generation circuit 250 may generate a target address corresponding to the (K+1 (or K−1))-th word line when the first refresh operation of a target refresh section is performed; may generate a target address corresponding to the (K+2 (or K−2))-th word line when the second refresh operation of the target refresh section is performed; may generate an address corresponding to the (K−2 (or K+2))-th word line when the third refresh operation of the target refresh section is performed; and may generate a target address corresponding to the (K−1 (or K+1))-th word line when the fourth refresh operation of the target refresh section is performed.

The control circuit 260 may activate a word line corresponding to an address AX<0:9> in response to the active command ACT and precharge the activated word line in response to the precharge command PRE. The control circuit 260 may refresh a word line corresponding to the counting address CA<0:7> in each of the banks BK0-BK3 when a refresh operation is performed in sections other than a target refresh section. The control circuit 260 may refresh a word line corresponding to the target address RHA<0:7> in each of the banks BK0-BK3 when a refresh operation is performed in the target refresh section.

The control circuit 260 may perform a first or second target refresh operation whenever a specific number of all-bank refresh operations are performed. The control circuit 260 may perform the first target refresh operation (i.e., the (K−1) and (K+1)-th word lines are subject to a target refresh operation) once whenever the all-bank refresh operation is executed 8 times and may perform the second target refresh operation (i.e., the (K−2), (K−1), (K+1), and (K+2)-th word lines are subject to a target refresh operation) once whenever the all-bank refresh operation is performed 64 times. If the second target refresh operation is performed, the memory device may not perform the first target refresh operation. Frequency that the memory device performs the first and the second target refresh operations may be changed depending on the design.

Figure 2:
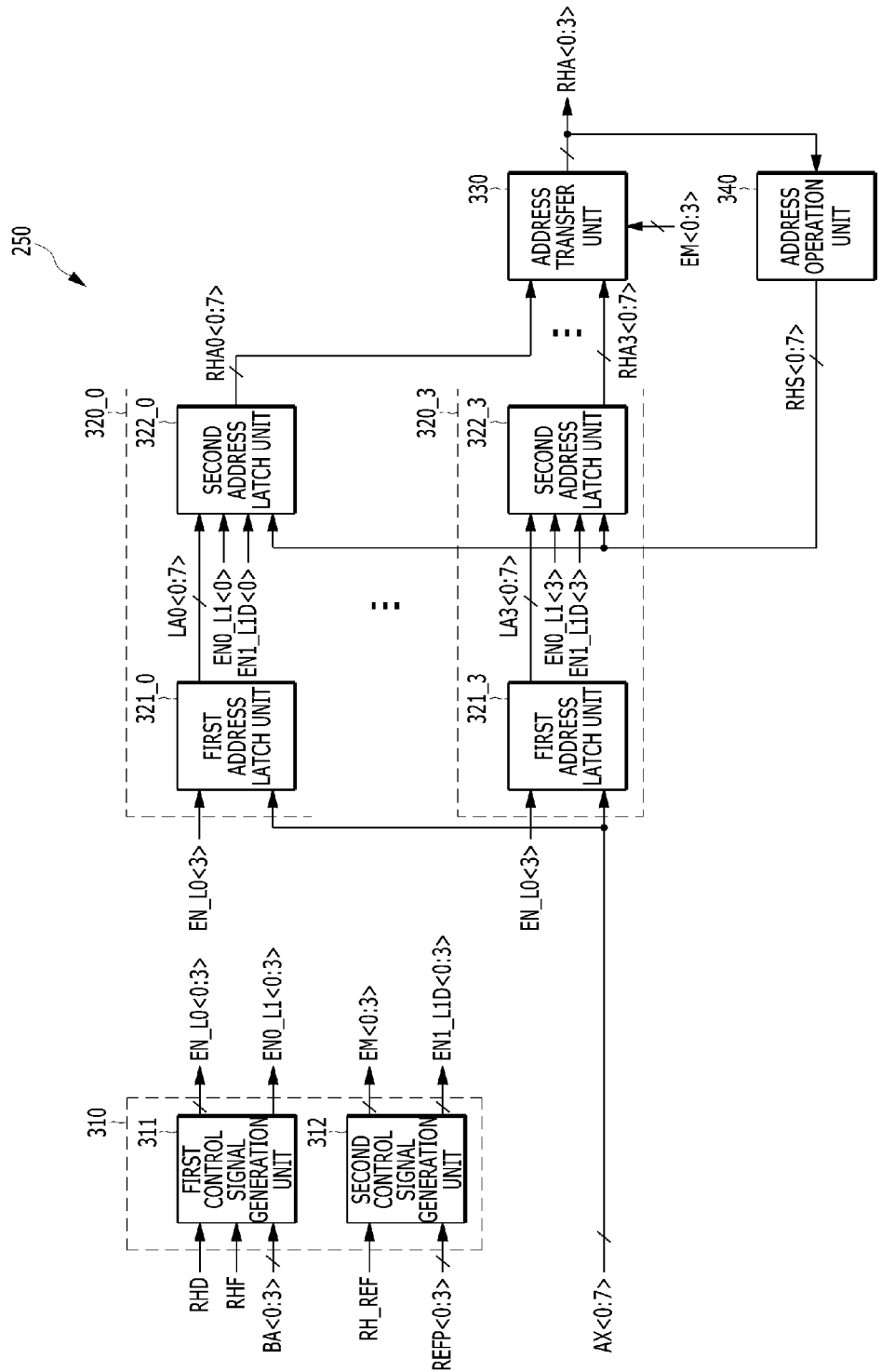
FIG. 2 is a diagram illustrating the configuration of an address generation circuit 250.

Referring to FIG. 2, a diagram illustrating the configuration of the address generation circuit 250 is described.

In FIG. 2, the address generation circuit 250 may include a control signal generation unit 310, a plurality of latch units 320_0-320_3, an address transfer unit 330, and an address operation unit 340.

A detection signal RHD may be a signal that is periodically toggles. The section in which the detection signal RHD has been activated may be a sampling section. Further, the section in which the detection signal RHD has been deactivated may be a non-sampling section. A signal RHF is indicative of a target refresh section and may be a signal activated in a target refresh section and deactivated in sections other than the target refresh section.

The address generation circuit 250 may latch the least significant bit AX<0> of the address AX<0:7> by inverting the least significant bit AX<0> in the sampling section and may not latch the address AX<0:7> in the non-sampling section.

The control signal generation unit 310 may include first and second control signal generation units 311 and 312. The first control signal generation unit 311 generates a plurality of first control signals EN_L0<0:3>. The first control signal generation unit 311 may activate the first control signal EN_L0<0:3> corresponding to an activated bank active signal when the bank active signal BA<0:3> is activated in the state in which the detection signal RHD has been activated. The first control signal generation unit 311 generates a plurality of second control signals EN0_L1<0:3>; may activate a second control signal corresponding to an activated first control signal in the section in which the signal RHF has been deactivated; and may deactivate the second control signals EN0_L1<0:3> in the section in which the signal RHF has been activated.

The second control signal generation unit 312 generates a plurality of transfer signals EM<0:3> and a plurality of third control signals EN1_L1D<0:3>. The second control signal generation unit 312 may also activate a corresponding transfer signal and third control signal only when each of signals REFP<0:3> is first activated in the section in which a signal RH_REF has been activated. The signal RH_REF may be a signal activated in accordance with the all-bank refresh section when the target refresh operation is performed. The REFP<0:3> may be a pulse signal activated in the refresh operation section of a corresponding bank. The third control signal may be a signal activated after a lapse of a specific time since a corresponding transfer signal has been activated. In this case, the third control signals may be activated after a lapse of the time that is taken for the address operation unit 340 to receive the target address RHA<0:7> and to generate RHS<0:7> by performing operation after the respective transfer signals have been activated.

The plurality of latch units 320_0-320_3 may latch A<0> of the addresses AX<0:7> of an activated word line as a target address by inverting the address A<0> in a corresponding bank in sections other than the target refresh section. Furthermore, the plurality of latch units 320_0-320_3 may latch the operation address RHS<0:7> as a target address once in each all-bank refresh section of a target refresh section. The plurality of latch units 320_0-320_3 may include first and second address latch units 321_0-321_3 and 322_0-322_3, respectively.

When a corresponding first control signal is activated, the first address latch units 321_0-321_3 latch the address AX<0:7>, but may latch the least significant bit AX<0> by inverting the least significant bit AX<0>. The first address latch units 321_0-321_3 may output latches addresses as outputs LA0<0:7>—LA3<0:7>. The second address latch units 322_0-322_3 may latch the addresses LA0<0:7>-LA3<0:7> of a corresponding first address latch unit when a corresponding second control signal is activated. The second address latch units 322_0-322_3 may also latch the operation address RHS<0:7> when a corresponding third control signal is activated.

The address transfer unit 330 may select one of the target addresses RHA0<0:7>-RHA3<0:7> and transfer the selected one to the address operation unit 340. The address transfer unit 330 may transfer the target address RHA0<0:7> as the target address RHA<0:7> when the transfer signal EM<0> is activated. The address transfer unit 330 may transfer the target address RHA1<0:7> as the target address RHA<0:7> when the transfer signal EM<1> is activated. The address transfer unit 330 may transfer the target address RHA2<0:7> as the target address RHA<0:7> when the transfer signal EM<2> is activated. Further, the address transfer unit 330 may transfer the target address RHA3<0:7> as the target address RHA<0:7> when the transfer signal EM<3> is activated.

For reference, the output addresses of the address latch units 320_0-320_3 and the output address of the address transfer unit 301 may be identically indicated as "target addresses." Each of the target addresses RHA0<0:7>-RHA3<0:7> corresponds to each bank. The target address RHA<0:7> is the target address of the bank BK0 when the transfer signal EM<0> is activated, the target address of the bank BK1 when the transfer signal EM<1> is activated, the target address of the bank BK2 when the transfer signal EM<2> is activated, and the target address of the bank BK3 when the transfer signal EM<3> is activated.

The address operation unit 340 may generate the operation address RHS<0:7> by adding a specific operation value to the target address RHA<0:7> or subtracting a specific operation value from the target address RHA<0:7>. Table 1 illustrates operation of the address operation unit 340 according to the type and refresh sequence of a target refresh section.

TABLE 1

| | FIRST TARGET REFRESH | | SECOND TARGET REFRESH | |
|---|---|---|---|---|
| | RHA<0> = "0" | RHA<0> = "1" | RHA<0> = "0" | RHA<0> = "1" |
| FIRST REFRESH | RHS<0:7> = RHA<0:7> + 2 | RHS<0:7> = RHA<0:7> − 2 | RHS<0:7> = RHA<0:7> − 1 | RHS<0:7> = RHA<0:7> + 1 |
| SECOND REFRESH | — | — | RHS<0:7> = RHA<0:7> − 4 | RHS<0:7> = RHA<0:7> + 4 |
| THIRD REFRESH | — | — | RHS<0:7> = RHA<0:7> + 1 | RHS<0:7> = RHA<0:7> − 1 |

For reference, the flag signals RH1_0 and RH1_1 may be signals activated when the first and the second refresh operations of the first target refresh section are respectively activated. Further, the flag signals RH2_0-RH2_3 may be signals activated when the first to the fourth refresh operations of the second target refresh section are respectively activated.

Figure 3:
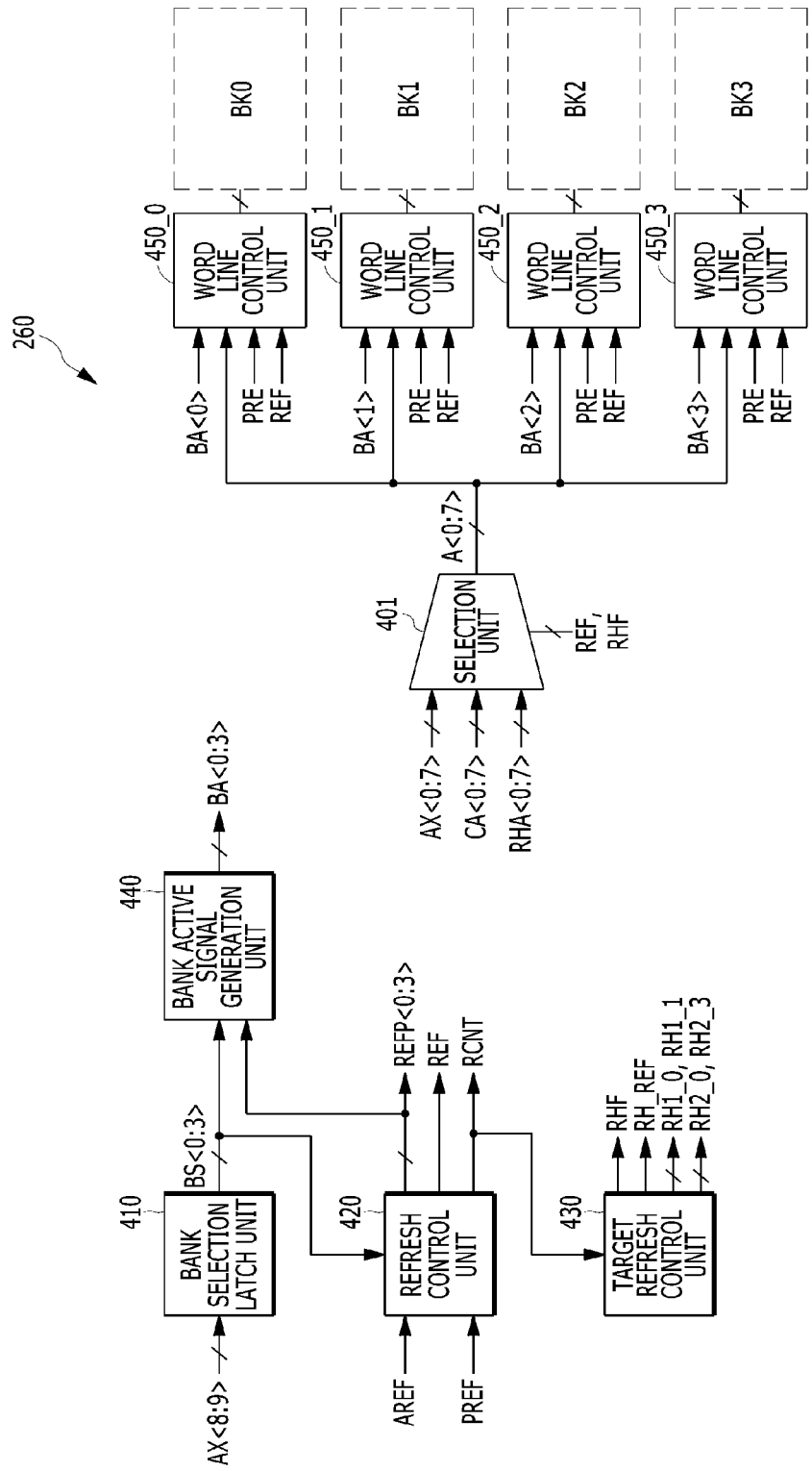
FIG. 3 is a diagram illustrating the configuration of a control circuit 260.

Referring to FIG. 3, a diagram illustrating the configuration of the control circuit 260 is described.

In FIG. 3, the control circuit 260 may include a bank selection unit 410, a refresh control unit 420, a target refresh control unit 430, a bank active signal generation unit 440, and word line control units 450_0-450_3.

The bank selection unit 410 generates BS<0:3>, and may activate a signal corresponding to AX<8:9> of BS<0:3>. The bank selection unit 410 may activate BS<0> when the value of AX<8:9> is "00"; may activate BS<1> when the value of AX<8:9> is "01"; may activate BS<2> when the value of AX<8:9> is "10"; and may activate BS<3> when the value of AX<8:9> is "11."

The refresh control unit 420 may sequentially activate the signals REFP<0:3> when the all-bank refresh command AREF is activated and may activate a signal REFP corresponding to an activated BS signal of the signals REFP<0: 3> when the per-bank refresh command PREF is activated.

The refresh control unit 420 may activate the counting value RCNT when the all-bank refresh command AREF is activated and all the signals REFP<0:3> are activated. The refresh control unit 420 may also activate the counting value RCNT when the per-bank refresh command PREF is consecutively activated by a number (e.g., 4 times) corresponding to the number of banks and all the signals REFP<0:3> are activated. The refresh control unit 420 may activate the signal REF activated in a refresh operation section in which a word line is active-precharged when the refresh command AREF is activated.

The target refresh control unit 430 may control the target refresh operation of the memory device. Whenever the counting value RCNT is activated, the target refresh control unit 430 performs counting and generates the signals RHF, RH_REF, RH1_0, RH1_1, and RH2_0-RH2_3 with reference to the counting value. Hereinafter, an example in which the memory device performs a first target refresh operation once while the all-bank refresh operation is executed 8 times; but performs the first target refresh operation when seventh and eighth all-bank refresh operations are performed; performs a second target refresh operation once while the all-bank refresh operation is executed 64 times; but performs the second target refresh operation when sixty-first-sixth fourth all-bank refresh operations are performed is described.

The target refresh control unit 430 may activate the signal RHF after the signal REF has been deactivated if the counting value RCNT corresponds to 6, 14, 22, 30, 38, 46, 54, or 60 times and may deactivate the signal RHF after the signal REF has been deactivated if the counting value RCNT corresponds to 8, 16, 24, 32, 40, 48, 56, or 64 times. The target refresh control unit 430 may activate the signal RH_REF in the refresh operation section of the section in which the signal RHF has been activated. The target refresh control unit 430 may activate the flag signal RH1_0 when a refresh operation is performed if the counting value RCNT is 7, 15, 23, 31, 39, 47, or 55. The target refresh control unit 430 may also activate the flag signal RH1_1 when a refresh operation is performed if the counting value RCNT is 8, 16, 24, 32, 40, 48, or 56. The target refresh control unit 430 may activate RH2_0, RH2_1, RH2_2, and RH2_3 when respective refresh operations are performed if the counting values RCNT are 61, 62, 63, and 64.

The bank active signal generation unit 440 generates bank active signals BA<0:3> corresponding to the respective banks BK0-BK3, but may activate a bank active signal corresponding to an activated BS signal when the active command ACT is activated or may activate a bank active signal corresponding to the activated signal REFP.

The selection unit 401 may select one of AX<0:7>, CA<0:7>, and RHA<0:7> and output a selected signal as A<0:7>. The selection unit 401 may output CA<0:7> as A<0:7> in the section in which the signal REF has been activated. The selection unit 401 may select the target address RHA<0:7> in the section in which the signals REF and RH_REF have been activated and output the selected the target address RHA<0:7> as A<0:7>. The selection unit 401 may select AX<0:7> in the section in which the signals REF and RH_REF have been deactivated and outputs the selected AX<0:7> as <0:7>.

The word line control units 450_0-450_3 may control the word lines of the respective banks BK0-BK3. The word line control units 450_0-450_3 may activate word lines corresponding to A<0:7> when corresponding bank active signals are activated. The word line control units 450_0-450_3 may precharge activated word lines when the precharge command PRE is activated or may precharge activated word lines after a lapse of a specific time after bank active signals have been activated if the signal REF has been activated.

Figure 4A:
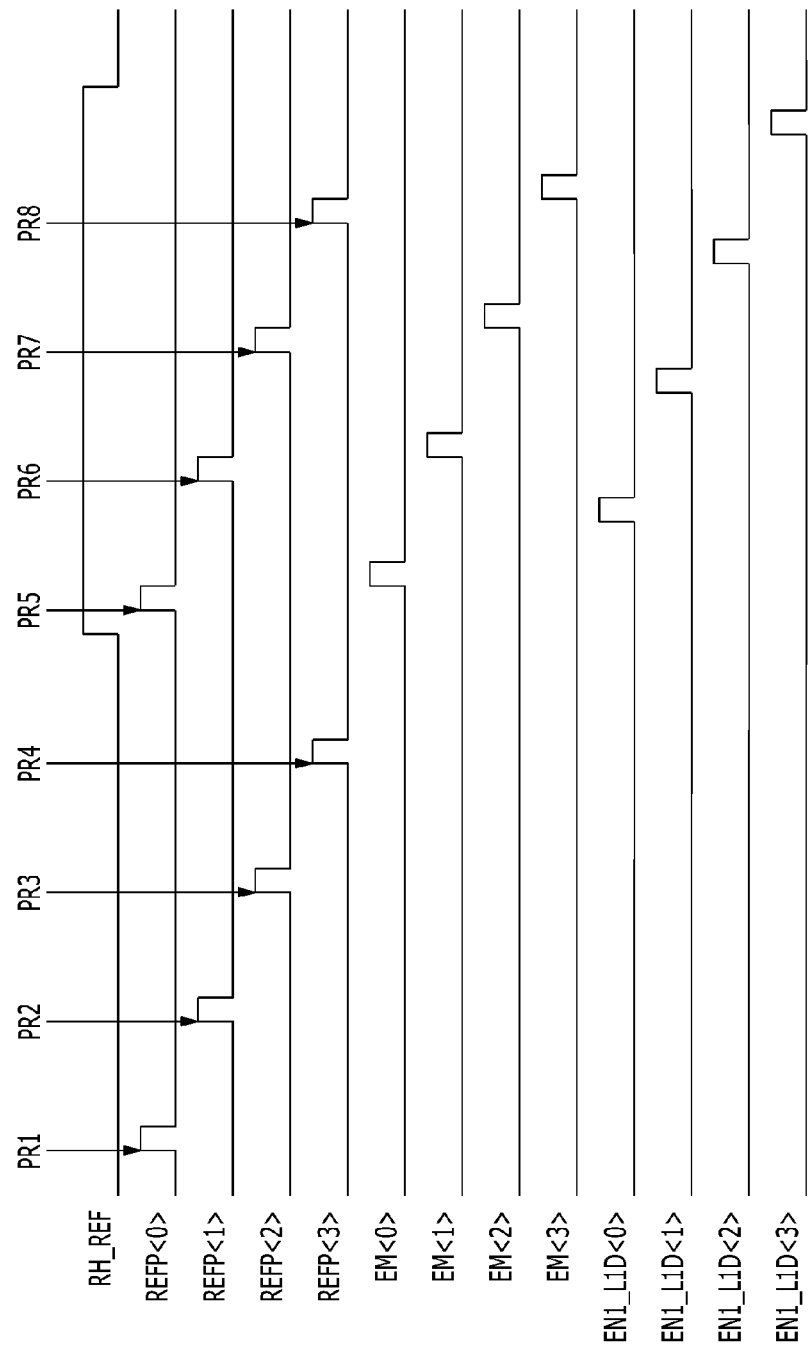

Referring to FIGS. 4a to 4c, diagrams illustrating the operation of the second control signal generation unit 312 when a target refresh operation is performed are described.

In FIG. 4a, whenever the per-bank refresh commands PR1-PR8 are inputted, one of the signals REFP<0:3> is activated. The second control signal generation unit 312 deactivates the transfer signals EM<0:3> and the control signals EN1_L1D<0:3> in the section in which the signal RH_REF has been deactivated. When the signals REFP<0: 3> are activated in the section in which the signal RH_REF has been activated, the second control signal generation unit 312 activated the respective transfer signals EM<0:3> and the respective control signals EN1_L1D<0:3>.

In FIG. 4b, whenever an all-bank refresh command AR1 or AR2 is inputted, the signals REFP<0:3> are sequentially activated. The second control signal generation unit 312 deactivates the transfer signals EM<0:3> and the control signals EN1_L1D<0:3> in the section in which the signal RH_REF has been deactivated. The second control signal generation unit 312 activates the transfer signals EM<0:3> and the control signals EN1_L1D<0:3> when the respective signals REFP<0:3> are activated in the section in which the signal RH_REF has been activated.

In FIG. 4c, when the per-bank refresh command PR1 or PR2 is inputted and the all-bank refresh command AR1 is inputted, the signal REFP<0> or REFP<1> is activated in response to the per-bank refresh command, and all the signals REFP<0:3> are sequentially activated in response to the all-bank refresh command AR1. If the signals REFP<0> and REFP<1> are first activated in response to the per-bank refresh command PR1 or PR2 in the section in which the signal RH_REF has been activated, the second control signal generation unit 312 activates the transfer signal EM<0>, the transfer signal EM<1>, the control signal EN1_L1D<0>, and the control signal EN1_L1D<1>. If the signals REFP<0>-REFP<3> are sequentially activated in response to the all-bank refresh command AR1 in the section in which the signal RH_REF has been activated, the second control signal generation unit 312 does not activate the transfer signal EM<0>, the transfer signal EM<1>, the control signal EN1_L1D<0>, and the control signal EN1_L1D<1> already activated in the section in which the signal RH_REF has been activated; but sequentially activates only the transfer signal EM<2>, the transfer signal EM<3>, the control signal EN1_L1D<2>, and the control signal EN1_L1D<3>.

The address generation circuit 250 performs calculation three times when the second target refresh operation is performed. Only when the calculation operation is performed once in the section in which the signal RH_REF has been activated, a proper word line may be subject to a target refresh operation when the second target refresh operation is performed. If the transfer signal EM<0:1> and the control signal EN1_L1D<0:1> are activated two or more times in the section in which the signal RH_REF has been activated in a condition, such as that of FIG. 4c, an improper word line may be subject to a target refresh operation because an erroneous operation address is stored in the second address latch units 322_0 and 322_1.

For example, it is assumed that the (K−2), (K−1), (K+1), and (K+2)-th word lines of the bank BK0 are subject to a second target refresh operation. If the address of a detected word line is "00101000", when the second target refresh operation is performed, the (K+1), (K+2), (K−2), and (K−1)-th word lines are sequentially refreshed. First, "00101001" inverted from the least significant bit of "00101000" is used as the target addresses RHA<0:7>. Next, pieces of operation +1, −4, and +1 are sequentially performed, and "00101010", "00100110", and "00100111" need to be used as the target addresses RHA<0:7>. If the transfer signal EM<0> and the control signal EN1_L1D<0> are activated twice, the operation −4 is performed twice, and accordingly "00100010" and "00100011" other than "00100110" and "00100111" may be used as target addresses. In the memory device in accordance with an embodiment of the invention, the transfer signals EM<0:3> and the third control signals EN1_L1D<0:3> are activated only once in the section in which the signal RH_REF has been activated, thereby being capable of preventing such an error from occurring.

Referring to FIG. 5, a diagram illustrating the refresh operation of the memory device of FIG. 1 is described.

An example in which the memory device performs a refresh operation in response to the all-bank refresh command AREF is described below. Furthermore, a description of an operation (e.g., a read operation or a write operation) performed between refresh operations is omitted.

The all-bank refresh commands AR1-AR64 may correspond to the all-bank refresh commands AREF inputted first to sixty fourth. When the all-bank refresh command AREF is inputted, all the banks BK0-BK3 are sequentially refreshed. NR may be indicative of a normal refresh operation performed using the counting address CA<0:7>. Further, TR may be indicative of a target refresh operation performed using the target address RHA<0:7>.

When the all-bank refresh commands AR1-AR6 are inputted, NR operations are performed. When the NR operation corresponding to the all-bank refresh command AR6 is completed, the signal RHF may be activated. When a TR operation corresponding to the all-bank refresh command AR8 is completed, the signal RHF may be deactivated. When a refresh operation is performed in the section in which the signal RHF has been activated, the signal RH_REF may be activated. When the first refresh operation of a first target refresh operation, the flag signal RH1_0 may be activated. When the second refresh operation of a second target refresh operation is performed, the flag signal RH1_1 may be activated. In the section in which the all-bank refresh commands AR9-AR16, AR17-AR24, AR25-AR32, AR33-AR40, AR41-AR48, and AR49-AR56 are inputted, the memory device may perform the same NR and TR operation as those performed in the section in which the all-bank refresh commands AR1-AR8 are inputted. When the all-bank refresh commands AR57-AR60 are inputted, the NR operation is performed. When an NR operation corresponding to the all-bank refresh command AR60 is completed, the signal RHF may be activated. When a TR operation corresponding to the all-bank refresh command AR64 is completed, the signal RHF may be deactivated. When the first to fourth refresh operations of the second target refresh operation are performed, the flag signals RH2_0-RH2_3 may be sequentially activated.

Table 2 illustrates refresh operations performed by the memory device depending on the number of applied refresh commands. NR denotes a normal refresh operation, TR1_0 and TR1_1 denote the first and second refresh operations of the first target refresh operation, and TR2_0-TR2_3 denote the first to fourth refresh operations of the second target refresh operation.

TABLE 2

| AR1 | AR2 | AR3 | AR4 | AR5 | AR6 | AR7 | AR8 |
|---|---|---|---|---|---|---|---|
| NR | NR | NR | NR | NR | NR | TR1_0 | TR1_1 |
| AR9 | AR10 | AR11 | AR12 | AR13 | AR14 | AR15 | AR16 |
| NR | NR | NR | NR | NR | NR | TR1_0 | TR1_1 |
| AR17 | AR18 | AR19 | AR20 | AR21 | AR22 | AR23 | AR24 |
| NR | NR | NR | NR | NR | NR | TR1_0 | TR1_1 |
| AR25 | AR26 | AR27 | AR28 | AR29 | AR30 | AR31 | AR32 |
| NR | NR | NR | NR | NR | NR | TR1_0 | TR1_1 |
| AR33 | AR34 | AR35 | AR36 | AR37 | AR38 | AR39 | AR40 |
| NR | NR | NR | NR | NR | NR | TR1_0 | TR1_1 |
| AR41 | AR42 | AR43 | AR44 | AR45 | AR46 | AR47 | AR48 |
| NR | NR | NR | NR | NR | NR | TR1_0 | TR1_1 |
| AR49 | AR50 | AR51 | AR52 | AR53 | AR54 | AR55 | AR56 |

TABLE 2-continued

| NR | NR | NR | NR | NR | NR | TR1_0 | TR1_1 |
|---|---|---|---|---|---|---|---|
| AR57 | AR58 | AR59 | AR60 | AR61 | AR62 | AR63 | AR64 |
| NR | NR | NR | NR | TR2_0 | TR2_1 | TR2_2 | TR2_3 |

Figure 6B:
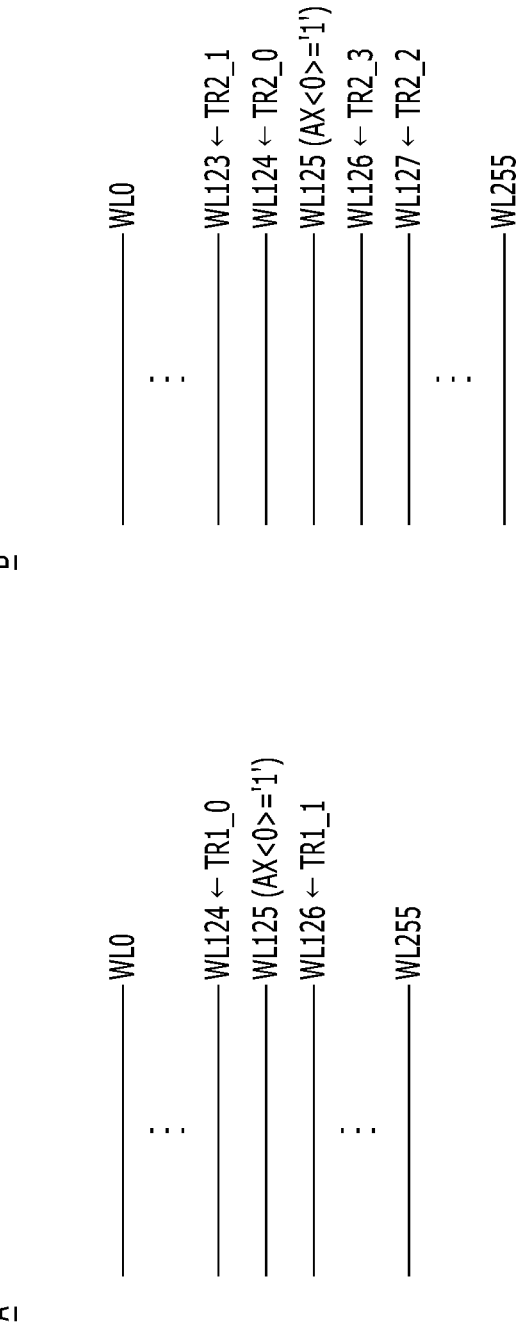

Referring to FIGS. 6a and 6b, diagrams illustrating the target refresh operation of the memory device of FIG. 1 are described.

If a detected word line is the word line WL124 (AX<0: 7>="01111100", AX<0>="0"), the first target refresh operation A and second target refresh operation B of the memory device are described below with reference to FIG. 6a. If the detected word line is the word line WL124, "01111101" inverted from the least significant bit of AX<0: 7>="01111100" is latched.

When the first refresh operation of the first target refresh operation is performed, the target refresh operation TR1_0 is performed on the word line WL125 corresponding to "01111101", and "01111011" subtracted from "01111101" by −2 is latched. When the second refresh operation of the second target refresh operation is performed, the target refresh operation TR1_1 is performed on the word line WL123 corresponding to "01111011."

When the first refresh operation of the second target refresh operation is performed, the target refresh operation TR2_0 is performed on the word line WL125 corresponding to "01111101" and "01111101" obtained by adding +1 to "01111110." When the second refresh operation of the second target refresh operation, the target refresh operation TR2_1 is performed on the word line WL126 corresponding to "01111110", and "01111010" subtracted from "01111110" by −4 is latched. When the third refresh operation of the second target refresh operation, the target refresh operation TR2_2 is performed on the word line WL122 corresponding to "01111010", and "01111011" obtained by adding +1 to "01111010" is latched. When the fourth refresh operation of the second target refresh operation, the target refresh operation TR2_3 is performed on the word line WL123 corresponding to "01111011."

If a detected word line is the word line WL125 (AX<0: 7>="01111101", AX<0>="1"), the first target refresh operation A and second target refresh operation B of the memory device are described below with reference to FIG. 6b. If the detected word line is the word line WL125, "01111100" inverted from the least significant bit of AX<0: 7>="01111101" is latched.

When the first refresh operation of the first target refresh is performed, the target refresh operation TR1_0 is performed on the word line WL124 corresponding to "01111100", and "01111110" obtained by adding +2 to "01111100" is latched. When the second refresh operation of the second target refresh, the target refresh operation TR1_1 is performed in the word line WL126 corresponding to "01111110."

When the first refresh operation of the second target refresh is performed, the target refresh operation TR2_0 is performed on the word line WL124 corresponding to "01111100", and "01111011" subtracted from "01111100" by −1 is latched. When the second refresh operation of the second target refresh operation, the target refresh operation TR2_1 is performed on the word line WL123 corresponding to "01111011", and "01111111" obtained by adding +4 to "01111011" is latched. When the third refresh operation of the second target refresh operation, the target refresh operation TR2_2 is performed on the word line WL127 corresponding to "01111111", and "01111110" subtracted from "01111111" by −1 is latched. When the fourth refresh operation of the second target refresh operation, the target refresh operation TR2_3 is performed on the word line WL126 corresponding to "01111110."

Figure 7:
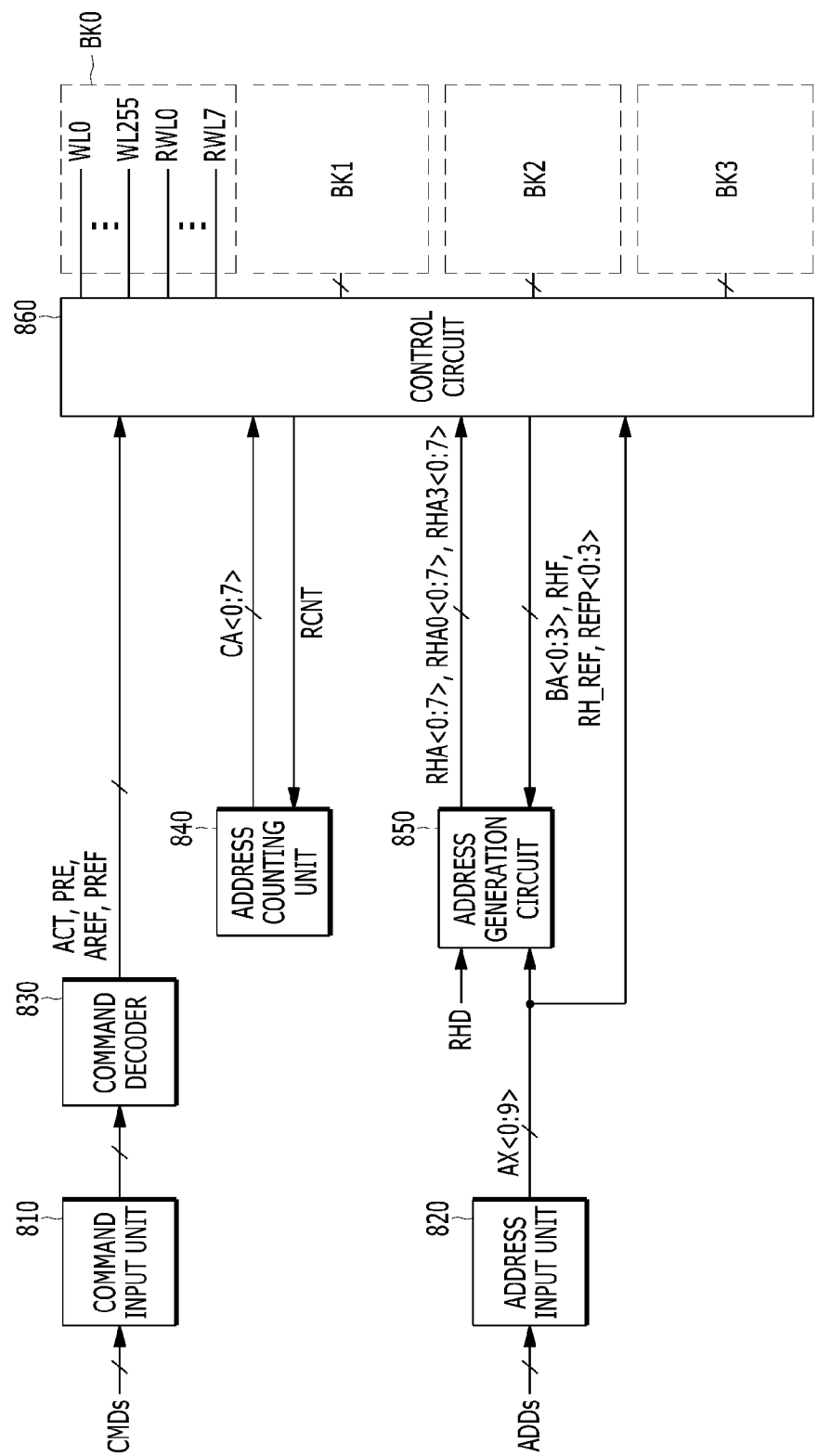
FIG. 7 is a diagram illustrating the configuration of a memory device in accordance with an embodiment of the invention.

Referring to FIG. 7, a diagram illustrating the configuration of a memory device in accordance with an embodiment of the invention is described.

In FIG. 7, the memory device may include a command input unit 810, an address input unit 820, a command decoder 830, an address counting unit 840, an address generation circuit 850, a control circuit 860, and a plurality of banks BK0-BK3.

The plurality of banks BK0-BK3 may include a plurality of word lines WL0-WL255 and redundancy word lines RWL0-RWL7 for replacing defective word lines. A plurality of memory cells MC may be electrically coupled to the word lines WL0-WL255 and the redundancy word lines RWL0-RWL7. The word lines WL0-WL255 may be disposed in order of "WL0"-"WL255." Further, the redundancy word lines RWL0-RWL7 may be sequentially disposed after the word line "WL255." FIG. 7 illustrates only the word lines, redundancy word lines, and memory cells of the bank "BK0", for convenience sake.

The configurations and operations of the command input unit 810, the address input unit 820, the command decoder 830, the address counting unit 840, and the address generation circuit 850 are the same as those of the command input unit 210, address input unit 220, command decoder 230, address counting unit 240, and address generation circuit 250 of the memory device of FIG. 1.

The control unit 860 may active a word line corresponding to an address AX<0:9> in response to an active command ACT and may precharge an activated word line in response to a precharge command PRE. In this instance, if the word line corresponding to the address AX<0:9> has been repaired, a redundancy word line that has repaired the word line corresponding to the address AX<0:9> may be active-precharged.

The control unit 860 may refresh a word line corresponding to a counting address CA<0:7> in each of the banks BK0-BK3 when a refresh operation is performed in sections other than a target refresh section. Further, the control unit 860 may refresh a word line corresponding to a target address RHA<0:7> in each of the banks BK0-BK3 when a refresh operation is performed in the target refresh section. In this case, if a word line corresponding to the counting address CA<0:7> in each of the banks has been repaired, a redundancy word line that has replaced the counting address CA<0:7> may be refreshed instead of the counting address CA<0:7>.

The control unit 860 may perform a first or second target refresh operation whenever a specific number of all-bank refresh operations are performed. The control unit 860 may perform the first target refresh operation once whenever the all-bank refresh operation is executed 8 times. The control unit 860 may perform the second target refresh operation once whenever the all-bank refresh operation is performed 64 times. In this case, if a detected word line has been repaired, a target refresh operation may be performed on redundancy word lines adjacent to a redundancy word line that has replaced the detected word line. For example, if an M-th redundancy word line has repaired a detected word line, (M−1) and (M+1)-th redundancy word lines may be refreshed when a first target refresh operation is performed, and (M−2), (M−1), (M+1), and (M+2)-th redundancy word lines may be refreshed when a second target refresh operation is performed.

The memory device may not perform the first target refresh operation when performing the second target refresh operation. Frequency that the memory device performs the first and the second target refresh operations may be varied depending on the design.

For reference, the repair unit of the memory device of FIG. 7 may be two word lines. The memory device may repair two word lines using two redundancy word lines as a single group. For example, when an error is generated in a word line WL45, the memory device may repair word lines WL44 and WL45 using redundancy word lines RWLK and RWLK+1 (K is 0, 2, 4, or 6). In this case, the redundancy word line RWLK may be replaced with the word line WL44, and the redundancy word line RWLK+1 may be replaced with the word line WL45.

banks BK0-BK3. If RED0-RED3 have been deactivated, the word line control units 960_0-960_3 may activate word lines corresponding to AD<0:7> when respective bank active signals are activated.

If each of RED0-RED3 has been activated, each of the word line control units 960_0-960_3 may activate each of signals RAX0<0:3>-RAX3<0:3> and a redundancy word line corresponding to AD<0> when each of the bank active signals is activated. Each of the word line control units 960_0-960_3 may precharge an activated word line when the precharge command PRE is activated or may precharge the activated word lines after a lapse of a specific time since the bank active signal has been activated if the signal REF has been activated.

Table 3 illustrates redundancy word lines selected in response to the RAX signal and a value of AD<0> in each of the banks.

TABLE 3

| | RAX | | | | | | | |
|---|---|---|---|---|---|---|---|---|
| | RAX0<0> | RAX0<1> | RAX0<2> | RAX0<3> | RAX1<0> | RAX1<1> | RAX1<2> | RAX1<3> |
| Bank | BK0 | BK0 | BK0 | BK0 | BK1 | BK1 | BK1 | BK1 |
| AD<0> = 0 | RWL0 | RWL2 | RWL4 | RWL6 | RWL0 | RWL2 | RWL4 | RWL6 |
| AD<0> = 1 | RWL1 | RWL3 | RWL5 | RWL7 | RWL1 | RWL3 | RWL5 | RWL7 |
| | RAX | | | | | | | |
| | RAX2<0> | RAX2<1> | RAX2<2> | RAX2<3> | RAX3<0> | RAX3<1> | RAX3<2> | RAX3<3> |
| Bank | BK2 | BK2 | BK2 | BK2 | BK3 | BK3 | BK3 | BK3 |
| AD<0> = 0 | RWL0 | RWL2 | RWL4 | RWL6 | RWL0 | RWL2 | RWL4 | RWL6 |
| AD<0> = 1 | RWL1 | RWL3 | RWL5 | RWL7 | RWL1 | RWL3 | RWL5 | RWL7 |

Figure 8:
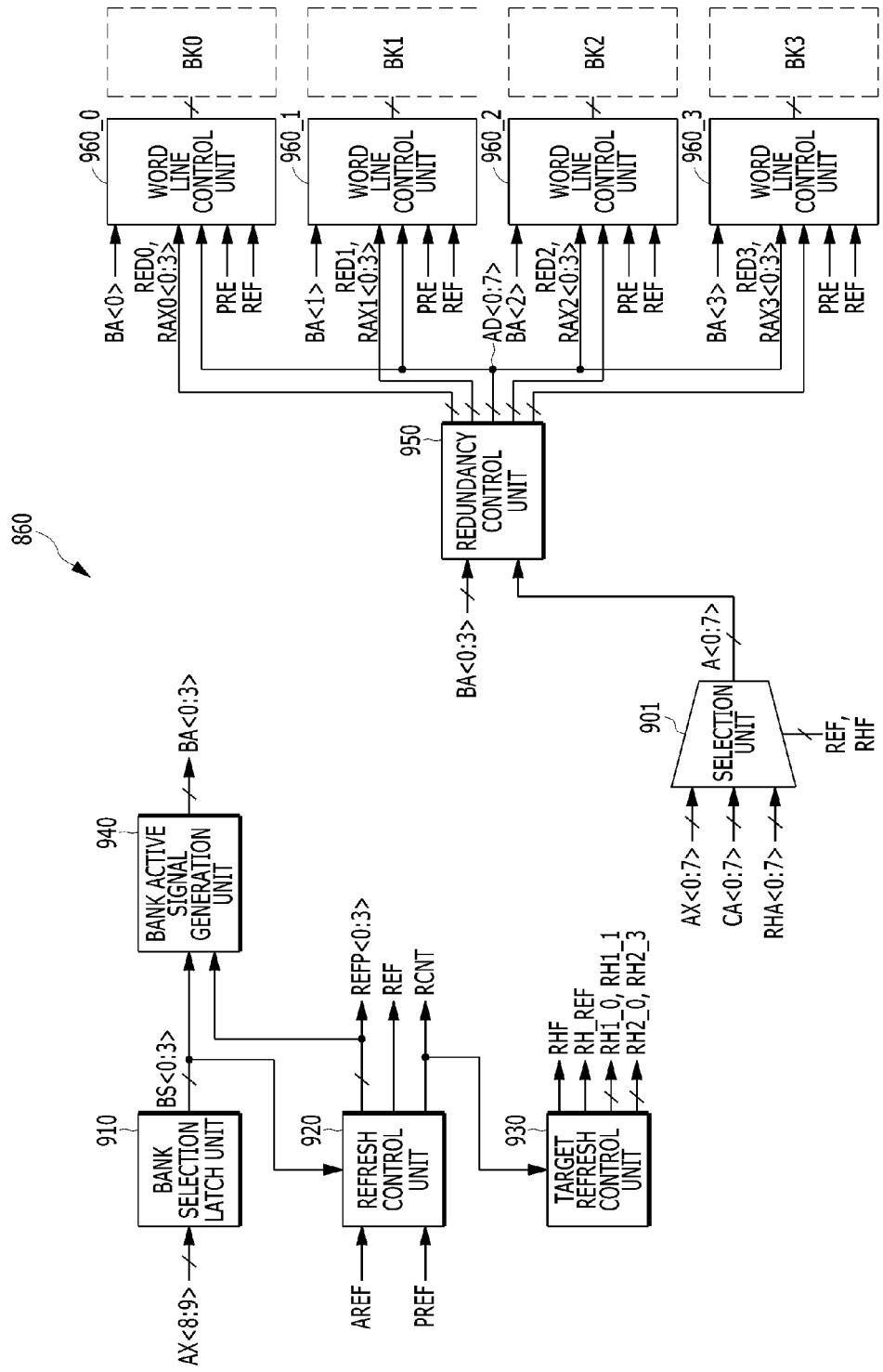
FIG. 8 is a diagram illustrating the configuration of a control circuit 960.

Referring to FIG. 8, a diagram illustrating the configuration of the control circuit 960 is described.

In FIG. 8, the control circuit 960 may include a bank selection unit 910, a refresh control unit 920, a target refresh control unit 930, a bank active signal generation unit 940, a redundancy control unit 950, and word line control units 960_0-960_3.

The configurations and operations of the bank selection unit 910, the refresh control unit 920, the target refresh control unit 930, the bank active signal generation unit 940, and the bank selection unit 910 are the same as those of the bank selection unit 410, refresh control unit 420, target refresh control unit 430, bank active signal generation unit 440, and selection unit 401 of the memory device of FIG. 3.

The redundancy control unit 950 may perform control so that a redundancy word line is activated or repaired if a word line corresponding to an address has been repaired when an active or normal refresh operation is performed. The redundancy control unit 950 may perform control so that the (M−1) and (M+1)-th redundancy word lines are refreshed when a first target refresh operation is performed if a detected word line has been repaired using the M-th redundancy word line. The redundancy control unit 950 a may perform control so that a target refresh operation is performed on the (M−2), (M−1), (M+1), and (M+2)-th redundancy word lines when, when a second target refresh operation is performed. The configuration and operation of the redundancy control unit 950 will be described later with reference to FIG. 9.

Figure 9:
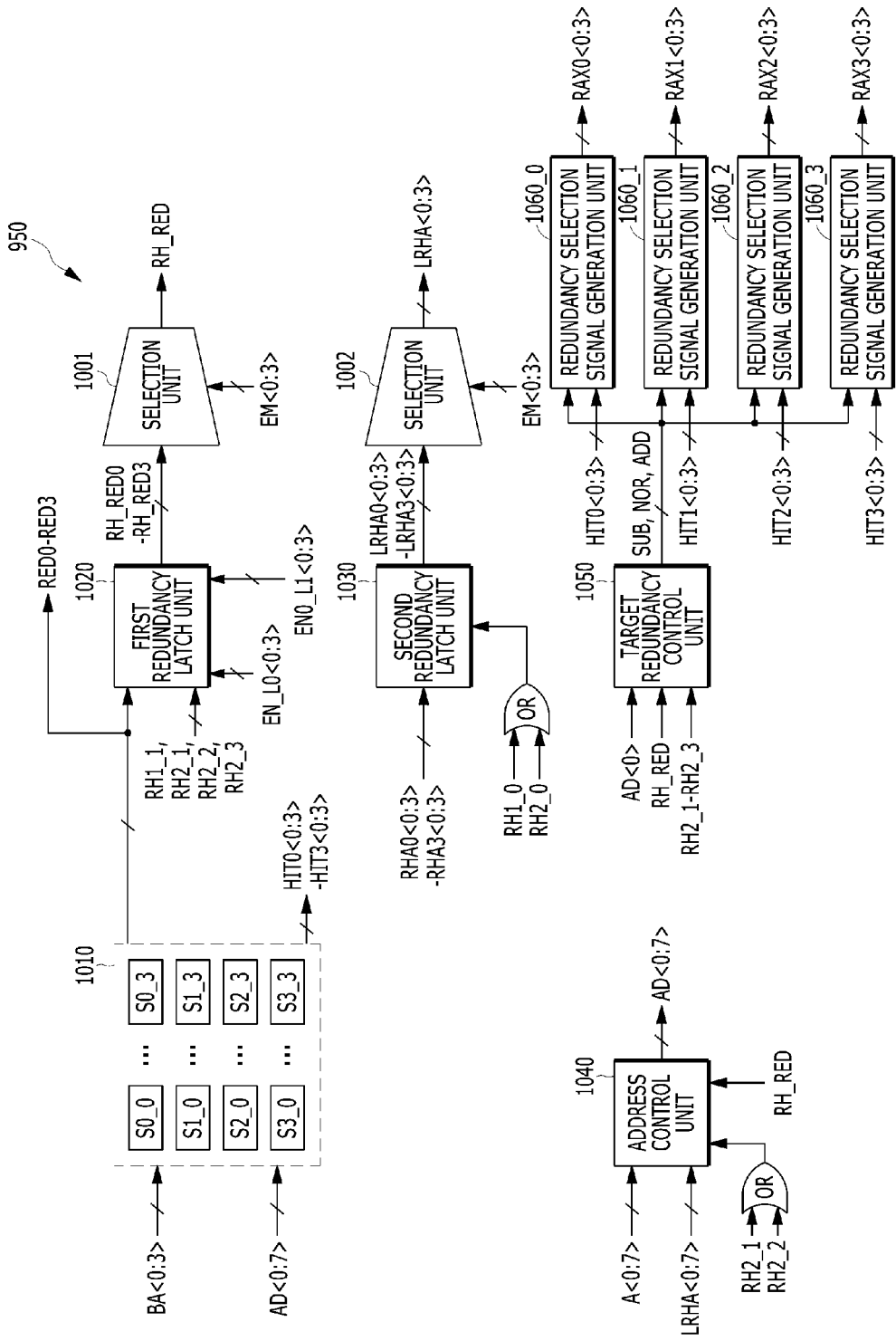
FIG. 9 is a diagram illustrating the configuration of a redundancy control unit 950.

The word line control units 960_0-960_3 may control the word lines and redundancy word lines of the respective Referring to FIG. 9, a diagram illustrating the configuration of the redundancy the control unit 950 is described.

In FIG. 9, the redundancy control unit 950 may include a repair address storage unit 1010, a first redundancy latch unit 1020, a second redundancy latch unit 1030, an address control unit 1040, a target redundancy control unit 1050, and a plurality of redundancy selection signal generation units 1060_0-1060_3.

The repair address storage unit 1010 may include storage units S0_0-S0_3, S1_0-S1_3, S2_0-S2_3, and S3_0-S3_3 corresponding to two of the redundancy word lines RWL0-RWL7 of the banks BK0-BK3. Table 4 illustrates the corresponding relationship between the storage unit and the redundancy word lines. The storage units S0_0-S3_3 may store the common part of the addresses of two redundancy word lines to be repaired in a corresponding bank. For example, if the word lines WL44 and WL45 of the bank BK0 are repaired using the redundancy word lines RWL2 and RWL3 of the bank BK0, "0010110", that is, 7 bits of the 8-bit address 00101100, 00101101 of the word lines WL44 and WL45, other than the least significant bits may be stored in the storage unit S0_1 corresponding to the redundancy word lines RWL2 and RWL3 of the bank BK0.

TABLE 4

| | STORAGE UNIT | | | | | | | |
|---|---|---|---|---|---|---|---|---|
| | S0_0 | S0_1 | S0_2 | S0_3 | S1_0 | S1_1 | S1_2 | S1_3 |
| BANK | BK0 | BK0 | BK0 | BK0 | BK1 | BK1 | BK1 | BK1 |
| REDUNDANCY | RWL0 | RWL2 | RWL4 | RWL6 | RWL0 | RWL2 | RWL4 | RWL6 |
| WORD LINE | RWL1 | RWL3 | RWL5 | RWL7 | RWL1 | RWL3 | RWL5 | RWL7 |

| | STORAGE UNIT | | | | | | | |
|---|---|---|---|---|---|---|---|---|
| | S2_0 | S2_1 | S2_2 | S2_3 | S3_0 | S3_1 | S3_2 | S3_3 |
| BANK | BK2 | BK2 | BK2 | BK2 | BK3 | BK3 | BK3 | BK3 |
| REDUNDANCY | RWL0 | RWL2 | RWL4 | RWL6 | RWL0 | RWL2 | RWL4 | RWL6 |
| WORD LINE | RWL1 | RWL3 | RWL5 | RWL7 | RWL1 | RWL3 | RWL5 | RWL7 |

The repair address storage unit 1010 may generate hit signals HIT0<0:3>-HIT3<0:3>. The repair address storage unit 1010 may activate a hit signal HIT corresponding to a storage unit in which an address identical with AD<1:7> has been stored. When BA<0> is activated, the repair address storage unit 1010 may compare addresses, stored in the storage units S0_0-S0_3, with AD<1:7> and generate the signal HIT0<0:3>. When BA<1> is activated, the repair address storage unit 1010 may compare an address, stored in the storage units S1_0-S1_3, with AD<1:7> and generate the signal HIT1<0:3>. When BA<2> is activated, the repair address storage unit 1010 may compare an address, stored in the storage units S2_0-S2_3, with AD<1:7> and generate the signal HIT2<0:3>. When BA<3> is activated, the repair address storage unit 1010 may compare an address, stored in the storage units S3_0-S3_3, with AD<0:7> and generate the signal HIT3<0:3>.

The repair address storage unit 1010 generates RED0-RED3 corresponding to the respective banks. In this case, the repair address storage unit 1010 may activate RED0 when one of the signals HIT0<0:3> is activated; may activate RED1 when one of the signals HIT0<0:3> is activated; may activate RED2 when one of the signals HIT0<0:3> is activated; and may activate RED3 when one of the signals HIT0<0:3> is activated.

The first redundancy latch unit 1020 may latch RED0 when EN_L0<0> is activated, may latch RED1 when EN_L0<1> is activated, may latch RED2 when EN_L0<2> is activated, and may latch RED3 when EN_L0<3> is activated. The first redundancy latch unit 1020 may latch the latched RED0 as RH_RED0 when EN0_L1<0> is activated, may latch the latched RED1 as RH_RED1 when EN0_L1<1> is activated, may latch the latched RED2 as RH_RED2 when EN0_L1<2> is activated, and may latch the latched RED3 as RH_RED3 when EN0_L1<3> is activated. Each of RH_RED0-RH_RED3 may be indicative of whether a detected word line of each of the banks has been repaired. The first redundancy latch unit 1020 may output the latched RH_RED0-RH_RED3 when RH1_1, RH2_1, RH2_2, or RH_3 is activated.

A selection unit 1001 may transfer RH_RED0 as RH_RED when EM<0> is activated, may transfer RH_RED1 as RH_RED when EM<1> is activated, may transfer RH_RED2 as RH_RED when EM<2> is activated, and may transfer RH_RED3 as RH_RED when EM<3> is activated.

When RH1_0 or RH2_0 is activated, the second redundancy latch unit 1030 may latch RHA0<0:3>-RHA3<0:3> and output the latched addresses as LRHA0<0:3>-LRHA3<0:3>. The second redundancy latch unit 1030 may latch the target address of each bank when the first refresh operation of a target refresh operation is performed and output the latched address.

A selection unit 1002 may transfer LRHA0<0:3> as LRHA<0:3> when EM<0> is activated; may transfer LRHA1<0:3> as LRHA<0:3> when EM<1> is activated; may transfer LRHA2<0:3> as LRHA<0:3> when EM<2> is activated; and may transfer LRHA3<0:3> as LRHA<0:3> when EM<3> is activated.

The address control unit 1040 may select A<0:7> when RH_RED is deactivated and transfer the selected A<0:7> as AD<0:7>; may select LRHA<0:7> when RH_RED is activated and transfer the selected LRHA<0:7> as AD<0:7>; and may invert LRHA<0> of LRHA<0>-LRHA<7> when RH2_1 or RH2_2 is activated along with RH_RED and transfer the inverted LRHA<0> as AD<0>.

The target redundancy control unit 1050 may generate SUB, NOR, and ADD in response to AD<0>, RH_RED, RH2_1, RH2_2, and RH2_3. When RH_RED is deactivated, the target redundancy control unit 1050 may activate NOR. If RH_RED has been activated and RH1_1 or RH2_3 has been activated, the target redundancy control unit 1050 may activate ADD when AD<0> is "0" and may activate SUB when AD<0> is "1." The target redundancy control unit 1050 may activate SUB if RH_RED and RH2_1 have been activated and may activate ADD if RH_RED and RH2_2 have been activated.

The redundancy selection signal generation units 1060_0-1060_3 may generate respective RAX0<0:3>-RAX3<0:3> for controlling the redundancy word lines of the respective banks. The redundancy selection signal generation unit 1060_0 may generate RAX0<0:3> in response to HIT0<0:3>, SUB, NOR, and ADD. The redundancy selection signal generation unit 1060_1 may generate RAX1<0:3> in response to HIT1<0:3>, SUB, NOR, and ADD. The redundancy selection signal generation unit 1060_2 may generate RAX2<0:3> in response to HIT2<0:3>, SUB, NOR, and ADD. The redundancy selection signal generation unit 1060_3 may generate RAX3<0:3> in response to HIT3<0:3>, SUB, NOR, and ADD.

Table 5 illustrates the activation or deactivation of RAX0<0:3>-RAX3<0:3> according to the activation or deactivation of HIT0<0:3>-HIT3<0:3>, SUB, NOR, and ADD.

TABLE 5

| | HIT0<0> activated | HIT0<1> activated | HIT0<2> activated | HIT0<3> activated |
|---|---|---|---|---|
| SUB activated | RAX0<3> activated | RAX0<0> activated | RAX0<1> activated | RAX0<2> activated |
| NOR activated | RAX0<0> activated | RAX0<1> activated | RAX0<2> activated | RAX0<3> activated |
| ADD | RAX0<1> | RAX0<2> | RAX0<3> | RAX0<0> |

TABLE 5-continued

| | | | | |
|---|---|---|---|---|
| activated | activated | activated | activated | activated |
| | HIT1<0> activated | HIT1<1> activated | HIT1<2> activated | HIT1<3> activated |
| SUB activated | RAX1<3> activated | RAX1<0> activated | RAX1<1> activated | RAX1<2> activated |
| NOR activated | RAX1<0> activated | RAX1<1> activated | RAX1<2> activated | RAX1<3> activated |
| ADD activated | RAX1<1> activated | RAX1<2> activated | RAX1<3> activated | RAX1<0> activated |
| | HIT2<0> activated | HIT2<1> activated | HIT2<2> activated | HIT2<3> activated |
| SUB activated | RAX2<3> activated | RAX2<0> activated | RAX2<1> activated | RAX2<2> activated |
| NOR activated | RAX2<0> activated | RAX2<1> activated | RAX2<2> activated | RAX2<3> activated |
| ADD activated | RAX2<1> activated | RAX2<2> activated | RAX2<3> activated | RAX2<0> activated |
| | HIT3<0> activated | HIT3<1> activated | HIT3<2> activated | HIT3<3> activated |
| SUB activated | RAX3<3> activated | RAX3<0> activated | RAX3<1> activated | RAX3<2> activated |
| NOR activated | RAX3<0> activated | RAX3<1> activated | RAX3<2> activated | RAX3<3> activated |
| ADD activated | RAX3<1> activated | RAX3<2> activated | RAX3<3> activated | RAX3<0> activated |

Figure 10:
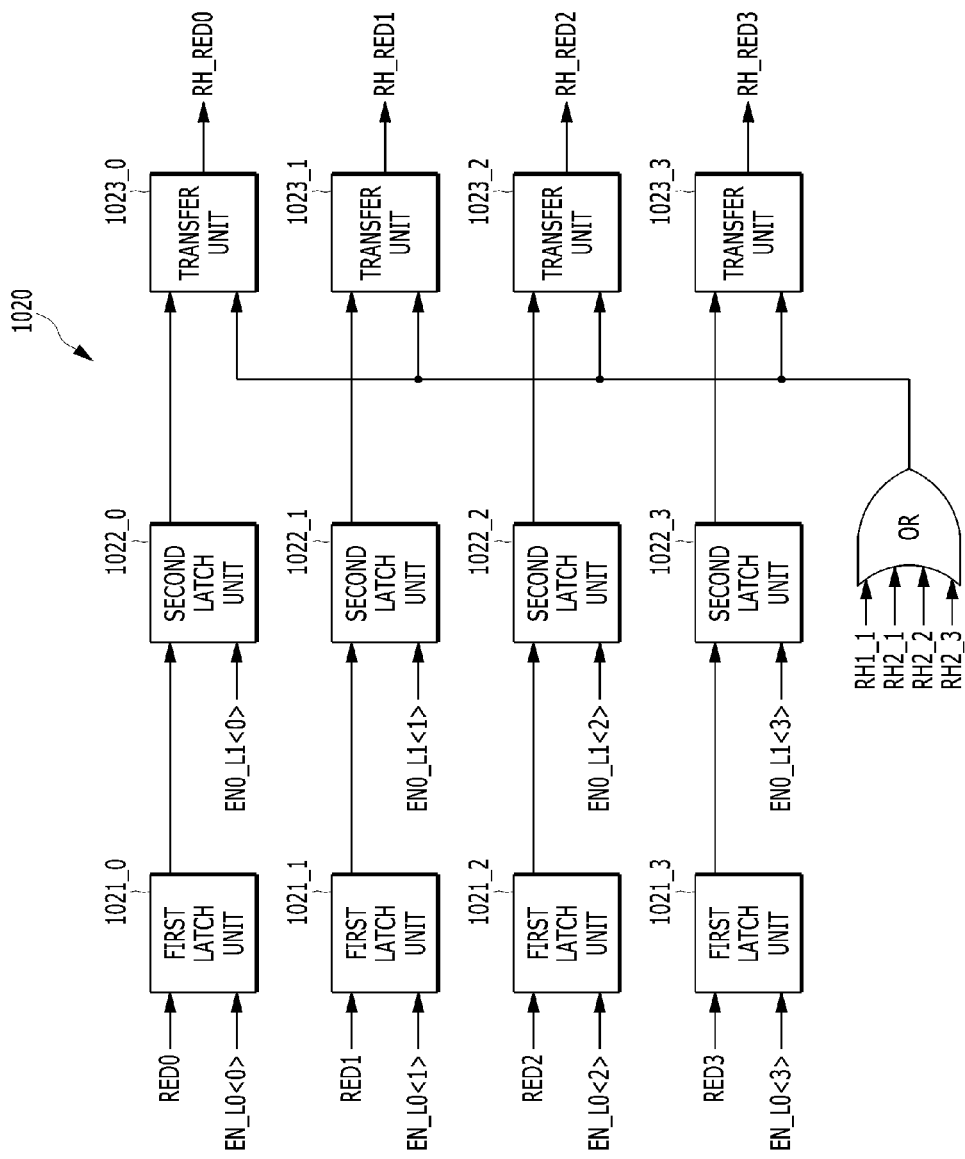
FIG. 10 is a diagram illustrating the configuration of a first redundancy latch unit 1020.

Referring to FIG. 10, a diagram illustrating the configuration of the first redundancy latch unit 1020 is described.

In FIG. 10, the first redundancy latch unit 1020 may include a plurality of first latch units 1021_0-1021_3, a plurality of second latch units 1022_0-1022_3, and a plurality of transfer units 1023_0-1023_3.

The first latch unit 1021_0 may latch RED0 when EN_L0<0> is activated. The first latch unit 1021_1 may latch RED1 when EN_L0<1> is activated. The first latch unit 1021_2 may latch RED2 when EN_L0<2> is activated. The first latch unit 1021_3 may latch RED3 when EN_L0<3> is activated. The first latch units 1021_0-1021_3 may output the latched values to the respective second latch units 1022_0-1022_3.

The second latch unit 1022_0 may latch the value output by the first latch unit 1021_0 when EN0_L1<0> is activated. The second latch unit 1022_1 may latch the value output by the first latch unit 1021_1 when EN0_L1<1> is activated. The second latch unit 1022_2 may latch the value output by the first latch unit 1021_2 when EN0_L1<2> is activated. The second latch unit 1022_3 may latch the value output by the first latch unit 1021_3 when EN0_L1<3> is activated. The second latch units 1022_0-1022_3 may output the latched values to the respective transfer units 1023_0-1023_3.

The transfer unit 1023_0 may transfer the value, output by the second latch unit 1022_0, as RH_RED0 when RH1_1, RH2_1, RH2_2, or RH2_3 is activated. The transfer unit 1023_1 may transfer the value, output by the second latch unit 1022_1, as RH_RED1 when RH1_1, RH2_1, RH2_2, or RH2_3 is activated. The transfer unit 1023_2 may transfer the value, output by the second latch unit 1022_2, as RH_RED2 when RH1_1, RH2_1, RH2_2, or RH2_3 is activated. The transfer unit 1023_3 may transfer the value, output by the second latch unit 1022_3, as RH_RED3 when RH1_1, RH2_1, RH2_2, or RH2_3 is activated.

Figure 11A:
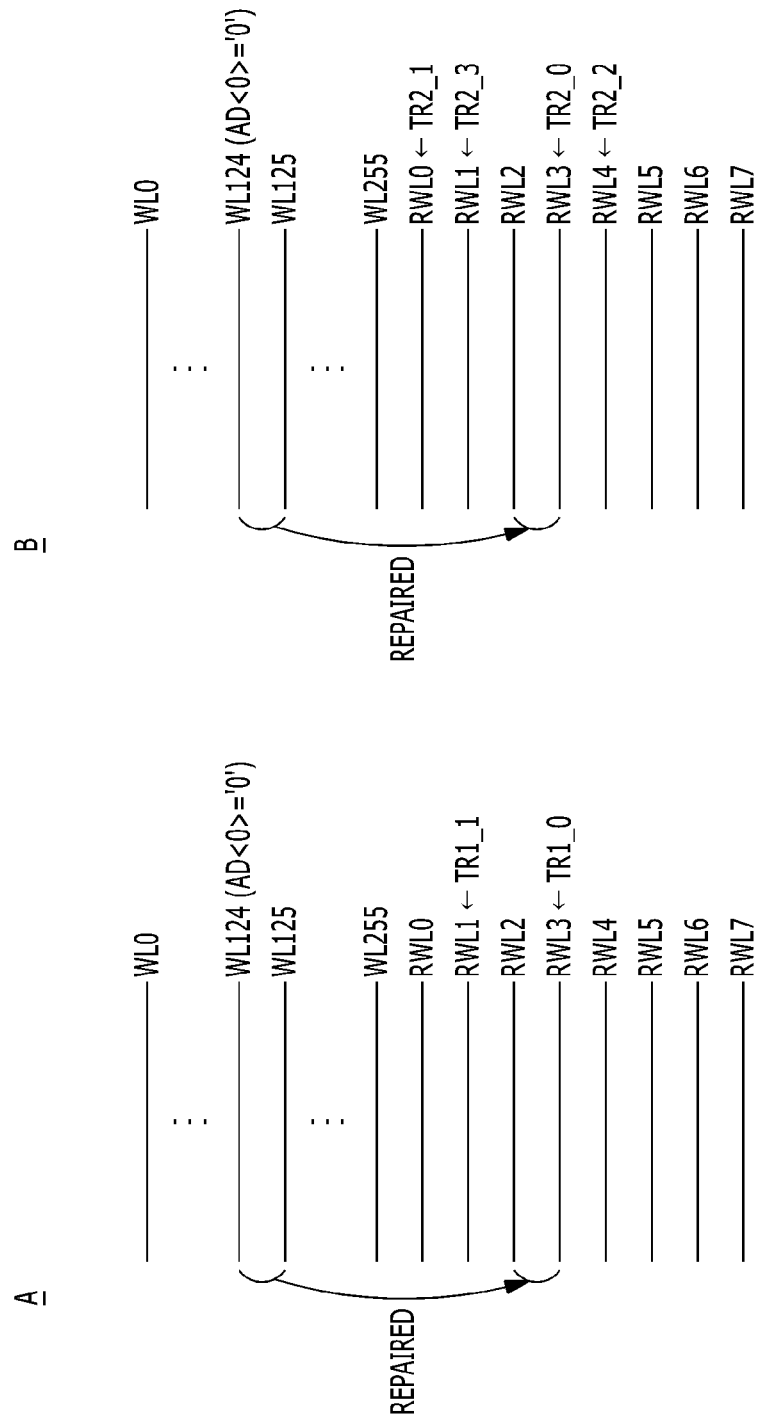
FIGS. 11a and 11b are diagrams illustrating the target refresh operation of the memory device of FIG. 7.
Figure 11B:
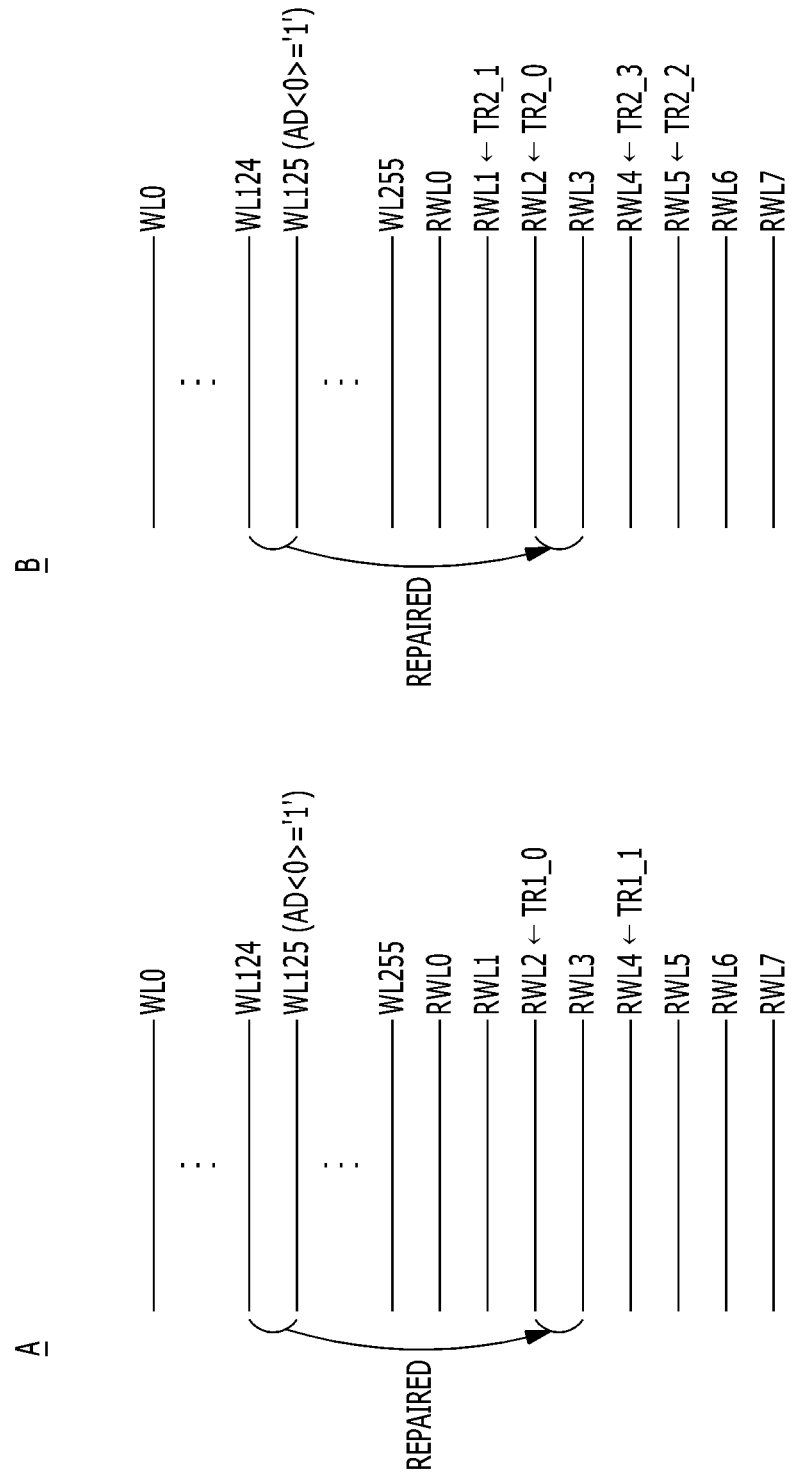

Referring to FIGS. 11a and 11b, diagrams illustrating the target refresh operation of the memory device of FIG. 7 are described.

If a detected word line is the word line WL124 (AX<0:7>="01111100", AX<0>="0") and the word lines WL124 and WL125 have been repaired by the redundancy word lines RWL2 and RWL3, the first target refresh operation A and second target refresh operation B of the bank BK0 of the memory device are described below with reference to FIG. 11a. For a repair, "0111110", that is, the common part of the addresses of the word lines WL124 and WL125, is stored in the storage unit S0_1. If the detected word line is the word line WL124, "01111101" inverted from the least significant bit of AX<0:7>="01111100" is latched.

When the first refresh operation of the first target refresh operation is performed, "01111101" latched in the address latch unit 322_0 is transferred as AD<0:7> through a process of RHA0<0:7>→RHA<0:7>→A<0:7>→AD<0:7> (RH_RED is deactivated). The repair address storage unit 1010 compares "0111110", that is, the upper 7 bits of "01111101", with values stored in the storage units S0_0-S0_3. HIT0<1> and RED0 are activated because the value stored in the storage unit S0_1 is the same as that of AD<1:7>. Since H_RED has been deactivated, NOR is activated, and thus RAX0<1> is activated in response to NOR and HIT0<1>. Since RAX0<1> is activated and AD<0>="1", the redundancy word line RWL3 of the bank BK0 is refreshed (TR1_0). In this instance, the address "01111101" used in the activation is latched in the second redundancy latch unit 1030 as LRHA0<0:7>. RH_RED used in this case is latched when AX<0:7> is latched in the first address latch units 321_0-321_3 and second address latch units 322_0-322_3 of FIG. 3.

When the second refresh operation of the first target refresh operation is performed, "01111101" latched in the second redundancy latch unit 1030 is transferred as AD<0:7> through a process of LRHA0<0:7>→LRHA<0:7>→AD<0:7> (RH_RED is activated). The repair address storage unit 1010 compares "0111110", that is, the upper 7 bits of "01111101", with values stored in the storage units S0_0-S0_3. HIT0<1> and RED0 are activated because the value stored in the storage unit S0_1 is the same as that of AD<1:7>. SUB is activated because RH_RED and RH1_1 are activated and AD<0>="1". Accordingly, RAX0<0> is activated in response to SUB and HIT0<1>. Since RAX0<0> is activated and AD<0>="1", the redundancy word line RWL1 of the bank BK0 is refreshed (TR1_1).

When the first refresh operation of the second target refresh operation is performed, the redundancy word line RWL3 of the bank BK0 is refreshed (TR2_0) through the same process as the first refresh operation of the first target refresh operation. Furthermore, the address "01111101" is latched in the second redundancy latch unit 1030 as LRHA0<0:7>.

When the second refresh operation of the second target refresh operation is performed, "01111101" latched in the second redundancy latch unit 1030 is transferred as AD<0:7> through a process of LRHA0<0:7>→LRHA<0:7>→AD<0:7> (RH_RED is activated). In this case, "1", that is, the least significant bit of "01111101", is inverted and transferred as AD<0:7> (RH2_1 is activated). Accordingly, AD<0:7> becomes "01111100." The repair address storage unit 1010 compares "0111110", that is, the upper 7 bits of "01111100", with values stored in the storage units S0_0-S03. HIT0<1> and RED0 are activated because the value stored in the storage unit S0_1 is the same as that of AD<1:7>. SUB is activated because RH_RED and RH2_1 have been activated, and thus RAX0<0> is activated in response to SUB and HIT0<1>. Since RAX0<0> is activated and AD<0>="0", the redundancy word line RWL0 of the bank BK0 is refreshed (TR2_1).

When the third refresh operation of the second target refresh operation is performed, "01111101" latched in the second redundancy latch unit 1030 is transferred as AD<0:7> through a process of LRHA0<0:7>→LRHA<0:7>→AD<0:7> (RH_RED is activated). In this case, "1", that is, the least significant bit of "01111101", is inverted and transferred as AD<0:7> (RH2_2 is activated). Accordingly, AD<0:7> becomes "01111100." The repair address storage unit 1010 compares "0111110", that is, the upper 7 bits of "01111100", with values stored in the storage units S0_0-S0_3. HIT0<1> and RED0 are activated because the value stored in the storage unit S0_1 is the same as that of AD<1:7>. ADD is activated because RH_RED and RH2_2 have been activated, and thus RAX0<2> is activated in response to ADD and HIT0<1>. Since RAX0<2> is activated and AD<0>="0", the redundancy word line RWL4 of the bank BK0 is refreshed (TR2_2).

When the fourth refresh operation of the second target refresh operation is performed, "01111101" latched in the second redundancy latch unit 1030 is transferred as AD<0:7> through a process of LRHA0<0:7>→LRHA<0:7>→AD<0:7> (RH_RED is activated). The repair address storage unit 1010 compares "0111110", that is, the upper 7 bits of "01111101", with values stored in the storage units S0_0-S0_3. HIT0<1> and RED0 are activated because the value stored in the storage unit S0_1 is the same as that of AD<1:7>. SUB is activated because RH_RED and RH2_3 are activated and AD<0>="1", and thus RAX0<0> is activated in response to SUB and HIT0<1>. Since RAX0<0> is activated and AD<0>="1", the redundancy word line RWL1 of the bank BK0 is refreshed (TR2_3).

If a detected word line is the word line WL125 (AX<0:7>="01111101", AX<0>="1") and the word lines WL124 and WL125 have been repaired by the redundancy word lines RWL2 and RWL3, the first target refresh operation A and second target refresh operation B of the bank BK0 of the memory device are described below with reference to FIG. 11b. For a repair, "0111110", that is, the common part of the addresses of the word lines WL124 and WL125, is stored in the storage unit S0_1. If the detected word line is the word line WL125, "01111100" inverted from the least significant bit of AX<0:7>="01111101" is latched.

When the first refresh operation of the first target refresh operation is performed, "01111100" latched in the address latch unit 322_0 is transferred as AD<0:7> through a process of RHA0<0:7>→RHA<0:7>→A<0:7>→AD<0:7> (RH_RED is deactivated). The repair address storage unit 1010 compares "0111110", that is, the upper 7 bits of "01111100", with values stored in the storage units S0_0-S0_3. HIT0<1> and RED0 are activated because the value stored in the storage unit S0_1 is the same as that of AD<1:7>. NOR is activated because RH_RED has been deactivated, and thus RAX0<1> is activated in response to NOR and HIT0<1>. Since RAX0<1> is activated and AD<0>="0", the redundancy word line RWL2 of the bank BK0 is refreshed (TR1_0). In this instance, the address "01111100" is latched in the second redundancy latch unit 1030 as LRHA0<0:7>.

When the second refresh operation of the first target refresh operation is performed, "01111100" latched in the second redundancy latch unit 1030 is transferred as AD<0:7> through a process of LRHA0<0:7>→LRHA<0:7>→AD<0:7> (RH_RED is activated). The repair address storage unit 1010 compares "0111110", that is, the upper 7 bits of "01111100", with values stored in the storage units S0_0-S0_3. HIT0<1> and RED0 are activated because the value stored in the storage unit S0_1 is the same as that of AD<1:7>. ADD is activated because RH_RED and RH1_1 are activated and AD<0>="0", and thus RAX0<2> is activated in response to ADD and HIT0<1>. Since RAX0<2> is activated and AD<0>="0", the redundancy word line RWL4 of the bank BK0 is refreshed (TR1_1).

When the first refresh operation of the second target refresh is performed, the redundancy word line RWL2 of the bank BK0 is refreshed (TR2_0) through the same process as the first refresh operation of the first target refresh operation. Furthermore, the address "01111100" is latched in the second redundancy latch unit 1030 as LRHA0<0:7>.

When the second refresh operation of the second target refresh operation is performed, "01111100" latched in the second redundancy latch unit 1030 is transferred as AD<0:7> through a process of LRHA0<0:7>→LRHA<0:7>→AD<0:7> (RH_RED is activated). In this case, "0", that is, the least significant bit of "01111100", is inverted and transferred as AD<0:7> (RH2_1 is activated). Accordingly, AD<0:7> becomes "01111101." The repair address storage unit 1010 compares "0111110", that is, the upper 7 bits of "01111101", with values stored in the storage units S0_0-S0_3. HIT0<1> and RED0 are activated because the value stored in the storage unit S0_1 is the same as that of AD<1:7>. SUB is activated because RH_RED and RH2_1 have been activated, and thus RAX0<0> is activated in response to SUB and HIT0<1>. Since RAX0<0> is activated and AD<0>="1", the redundancy word line RWL1 of the bank BK0 is refreshed (TR2_1).

When the third refresh operation of the second target refresh operation is performed, "01111100" latched in the second redundancy latch unit 1030 is transferred as AD<0:7> through a process of LRHA0<0:7>→LRHA<0:7>→AD<0:7> (RH_RED is activated). In this instance, "0", that is, the least significant bit of "01111100", is inverted and transferred as AD<0:7> (RH2_2 is activated). Accordingly, AD<0:7> becomes "01111101." The repair address storage unit 1010 compares "0111110", that is, the upper 7 bits of "01111101", with values stored in the storage units S0_0-S0_3. HIT0<1> and RED0 are activated because the value stored in the storage unit S0_1 is the same as that of AD<1:7>. ADD is activated because RH_RED and RH2_2 have been activated, and thus RAX0<2> is activated in response to ADD and HIT0<1>. Since RAX0<2> is activated and AD<0>="1", the redundancy word line RWL5 of the bank BK0 is refreshed (TR2_2).

When the fourth refresh operation of the second target refresh operation is performed, "01111100" latched in the second redundancy latch unit 1030 is transferred as AD<0:7> through a process of LRHA0<0:7>→LRHA<0:7>→AD<0:7> (RH_RED is activated). The repair address storage unit 1010 compares "0111110", that is, the upper 7 bits of "01111100", with values stored in the storage units S0_0-S0_3. HIT0<1> and RED0 are activated because the value stored in the storage unit S0_1 is the same as that of AD<1:7>. ADD is activated because RH_RED and RH2_3 have been activated and AD<0>="0", and accordingly RAX0<2> is activated in response to ADD and HIT0<1>. Since RAX0<2> is activated and AD<0>="0", the redundancy word line RWL4 of the bank BK0 is refreshed (TR2_3).

The memory device of FIG. 7 can prevent an improper word line from being refreshed in the second target refresh operation because it has the same effect as the memory device of FIG. 1. Furthermore, the memory device of FIG. 7 can perform control so that target word lines adjacent to a redundancy word line that has replaced a detected word line are refreshed when the first and the second target refresh operations are performed although the detected word line has been repaired by the redundancy word line.

Figure 12:
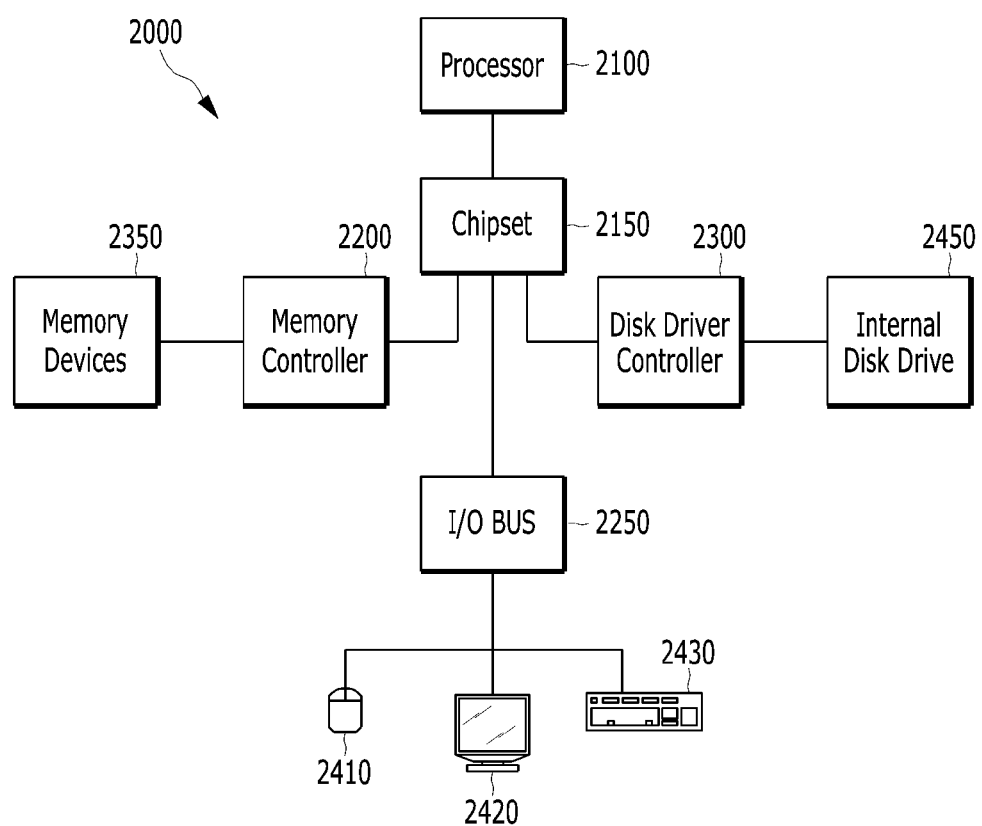
FIG. 12 illustrates a block diagram of a system employing a memory controller circuit in accordance with an embodiment of the invention.

Referring to FIG. 12, a system 2000 may include one or more processors 2100. The processor 2100 may be used individually or in combination with other processors. A chipset 2150 may be electrically coupled to the processor 2100. The chipset 2150 is a communication pathway for signals between the processor 2100 and other components of the system 2000. Other components may include a memory controller 2200, an input/output ("I/O") bus 2250, and a disk drive controller 2300. Depending on the configuration of the system 2000, any one of a number of different signals may be transmitted through the chipset 2150.

The memory controller 2200 may be electrically coupled to the chipset 2150. The memory controller 200 can receive a request provided from the processor 2100 through the chipset 2150. The memory controller 2200 may be electrically coupled to one or more memory devices 2350. The memory devices 2350 may include the memory device described above.

The chipset 2150 may also be electrically coupled to the I/O bus 2250. The I/O bus 2250 may serve as a communication pathway for signals from the chipset 2150 to I/O devices 2410, 2420 and 2430. The I/O devices 2410, 2420 and 2340 may include a mouse 2410, a video display 2420, or a keyboard 2430. The I/O bus 2250 may employ any one of a number of communications protocols to communicate with the I/O devices 2410, 2420 and 2430.

The disk drive controller 2300 may also be electrically coupled to the chipset 2150. The disk drive controller 2300 may serve as the communication pathway between the chipset 2150 and one or more internal disk drives 2450. The disk driver controller 2300 and the internal disk drives 2450 may communicate with each other or with the chipset 2150 using virtually any type of communication protocol.

In accordance with the invention, a target address generated for a target refresh operation in a memory device can be generated at a proper value.

Furthermore, the deterioration of data stored in a memory cell attributable to word line disturbance in a memory device can be prevented.

Although various embodiments have been described for illustrative purposes, it will be apparent to those skilled in the art that various changes and modifications may be made without departing from the spirit and scope of the invention as defined in the following claims.

What is claimed is:

1. A memory device, comprising:
    a plurality of banks suitable for comprising a plurality of word lines;
    a plurality of latch units each suitable for generating a first address by inverting a predetermined bit of an address of an activated word line of a corresponding bank and latching the first address as a target address in sections other than a target refresh section, and latching an operation address as the target address once in an all-bank refresh section of the target refresh section, wherein all of the plurality of banks are refreshed in the all-bank refresh section; and
    an address operation unit suitable for generating the operation address by adding or subtracting an operation value to or from the target address,
    wherein a word line among the plurality of word lines that is selected using the target address is refreshed in the target refresh section.

2. The memory device of claim 1, wherein the latch unit latches the operation address in a first refresh operation of the corresponding bank in the all-bank refresh section of the target refresh section and does not latch the operation address in operations other than the first refresh operation of the corresponding bank in the all-bank refresh section of the target refresh section.

3. The memory device of claim 1, wherein the all-bank refresh section comprises one or more of:
    a section in which a per-bank refresh command is consecutively inputted by a number corresponding to a number of plurality of banks and all the plurality of banks are refreshed, wherein the per-bank refresh command selects one of the plurality of banks and refreshes the selected bank,
    a section in which an all-bank refresh command is inputted and all the plurality of banks are refreshed, wherein the all-bank refresh command refreshes all the plurality of banks, and
    a sum of a section in which the selected bank is refreshed in response to the per-bank refresh command if the all-bank refresh command has been applied before the per-bank refresh command is consecutively inputted by the number corresponding to the number of plurality of banks and the section in which the all-bank refresh command is inputted and all the plurality of banks are refreshed.

4. The memory device of claim 3, wherein if the address of the activated word line is a K-th word line of the bank in the sections other than the target refresh section, (K−1) and (K+2)-th word lines are refreshed if the target refresh section is a first target refresh section and (K−2), (K−1), (K+1), and (K+2)-th word lines are refreshed if the target refresh section is a second target refresh section.

5. The memory device of claim 4, wherein the address operation unit determines the operation value and one of the addition and the subtraction to be performed depending on that a currently executed refresh operation corresponds to any one of refresh operations in any one of the first and the second target refresh sections and a value of specific bits of the target address in the currently executed refresh operation.

6. The memory device of claim 1, further comprising:
    an address transfer unit suitable for sequentially selecting the target addresses of the plurality of latch units one by one and transferring the selected target addresses to the address operation unit.

7. The memory device of claim 1, wherein each of the plurality of latch units latches an operation address generated by adding or subtracting the operation value to or from each target address.

8. The memory device of claim 1, wherein each of the plurality of latch units generates the first address by inverting the predetermined bit of an address of an activated word line of the corresponding bank and latches the first address as the target address, in a sampling section.

9. The memory device of claim 4, further comprising:
    a refresh counting unit suitable for generating refresh counting information by performing counting when the all-bank refresh command is inputted or the per-bank refresh command is consecutively inputted by the number corresponding to the number of plurality of banks.

10. The memory device of claim 9, further comprising:
    a target refresh control unit suitable for setting the target refresh section with reference to the refresh counting information, wherein the target refresh control unit generates a target refresh section signal indicative of the target refresh section and one or more flag signals indicating that a currently executed refresh operation corresponds to any one of refresh operations in any one of the first and the second target refresh sections.

11. The memory device of claim 8, further comprising:
a control signal generation unit suitable for generating a plurality of first control signals and activating a first control signal corresponding to a bank of the activated word line in the sampling section,
generating a plurality of second control signals and activating a second control signal corresponding to the activated first control signal in sections other than the first and the second target refresh sections in the sampling section, and
generating a plurality of third control signals and activating a third control signal corresponding to a bank on which a refresh operation is performed in a first refresh operation of the corresponding bank in the all-bank refresh section of the target refresh section.

12. The memory device of claim 11, wherein the latch unit latches the address of the activated word line of the corresponding bank when the corresponding first control signal is activated, latches the first address as the target address when the corresponding second control signal is activated, and latches the operation address as the target address when the corresponding third control signal is activated.

13. The memory device of claim 3, further comprising:
an address counting unit suitable for generating a counting address by performing counting when the all-bank refresh command is inputted and the plurality of banks is refreshed or when the per-bank refresh command is consecutively inputted by the number corresponding to the number of plurality of banks and the plurality of banks is refreshed.

14. The memory device of claim 13, wherein the word line that belongs to the plurality of word lines of the plurality of banks and that is selected using the counting address is refreshed when a refresh operation is performed in the sections other than the target refresh section.

15. A memory device, comprising:
a plurality of banks suitable for comprising a plurality of word lines and a plurality of redundancy word lines;
a plurality of first latch units suitable for generating a first address by inverting a predetermined bit of an address of an activated word line of a corresponding bank and latching the first address in sections other than a target refresh section, and latching an operation address as a target address in the target refresh section;
a plurality of second latch units suitable for latching whether a word line among the plurality of word lines corresponding to the target address of a first refresh operation in the target refresh section and the target address of the first refresh operation has been repaired; and
an address operation unit suitable for generating the operation address by adding or subtracting an operation value to or from the target address,
wherein (K−1) and (K+2)-th word lines or (K−2), (K−1), (K+1), and (K+2)-th word lines are refreshed using the target address and information latched in the second latch unit if the activated word line is a K-th word line in the sections other than the target refresh section, and (L−1) and (L+1)-th redundancy word lines or (L−2), (L−1), (L+1), and (L+2)-th redundancy word lines are refreshed using the target address and the information if the activated word line is an L-th redundancy word line in the sections other than the target refresh section.

16. The memory device of claim 15, wherein:
the (K−1) and (K+2)-th word lines or the (L−1) and (L+1)-th redundancy word lines are refreshed if the target refresh section is a first target refresh section, and
the (K−2), (K−1), (K+1), and (K+2)-th word lines or the (L−2), (L−1), (L+1) and (L+2)-th redundancy word lines are refreshed if the target refresh section is a second target refresh section.

17. The memory device of claim 16, wherein the address operation unit determines the operation value and one of the addition and the subtraction to be performed depending on that a currently executed refresh operation corresponds to any one of refresh operations in any one of the first and the second target refresh sections and a value of specific bits of the target address in the currently executed refresh operation.

18. The memory device of claim 17, further comprising:
a refresh counting unit suitable for generating refresh counting information by performing counting when an all-bank refresh command for refreshing all the plurality of banks is inputted or when a per-bank refresh command for selecting one of the plurality of banks and refreshing the selected bank is consecutively inputted by a number corresponding to a number of plurality of banks;
a target refresh control unit suitable for generating a target refresh section signal indicative of the target refresh section and one or more flag signals indicating that a currently executed refresh operation corresponds to any one of refresh operations in any one of the first and the second target refresh sections with reference to the refresh counting information; and
a plurality of address selection units each suitable for selecting one of the corresponding target address and an address latched in a corresponding second latch unit based on the flag signals and information latched in the corresponding second latch unit.

19. The memory device of claim 18, further comprising:
a plurality of hit signal generation units suitable for generating a plurality of hit signals corresponding to one or more of the plurality of redundancy word lines of the corresponding bank and activating one of the hit signals corresponding to one or more redundancy word lines that have repaired one or more word lines corresponding to a repair address if the repair address is identical with an output address of the corresponding address selection unit;
a redundancy address control unit suitable for activating any one of a subtraction signal, a normal signal, and an addition signal based on specific bits of the output address of the corresponding address selection unit, the flag signals, and the information latched in the corresponding second latch unit; and
a plurality of redundancy address generation units suitable for generating a plurality of redundancy addresses corresponding to one of more of the plurality of redundancy word lines of the corresponding bank, activating one of the redundancy addresses corresponding to an activated hit signal if the normal signal has been activated, activating an other redundancy address prior to the redundancy address corresponding to the activated hit signal if the subtraction signal has been activated, and activating one of the redundancy addresses that is subsequent to the redundancy address corresponding to the activated hit signal if the addition signal has been activated.

20. The memory device of claim 19, further comprising:
an address counting unit suitable for generating a counting address by performing counting when the all-bank refresh command is inputted and the plurality of banks is refreshed or when the per-bank refresh command is consecutively inputted by the number corresponding to the number of plurality of banks and the plurality of banks is refreshed.

21. The memory device of claim 20, further comprising:
a plurality of word line control units each suitable for refreshing a word line that belongs to the plurality of word lines of the corresponding bank and that is selected using the counting address when the refresh operation is performed in the sections other than the target refresh section and refreshing one of the word lines selected using the target address in the target refresh section; and
a plurality of redundancy word line control units suitable for refreshing a word line that belongs to the plurality of redundancy word lines of the corresponding bank and that is selected using specific bits of the output address of the corresponding address selection unit and a redundancy address of the corresponding redundancy address generation unit.

22. A memory device, comprising:
a plurality of banks suitable for comprising a plurality of word lines and a plurality of redundancy word lines;
a plurality of first latch units suitable for generating a first address by inverting a predetermined bit of an address of an activated word line of a corresponding bank and latching the first address as a target address in sections other than a target refresh section, and latching an operation address as the target address once in each all-bank refresh section of the target refresh section, wherein all the plurality of banks are refreshed in the all-bank refresh section;
a plurality of second latch units suitable for latching whether a word line among the plurality of word lines corresponding to the target address of a first refresh operation in the target refresh section and the target address of the first refresh operation has been repaired; and
an address operation unit suitable for generating the operation address by adding or subtracting an operation value to or from the target address,
wherein (K−1) and (K+2)-th word lines or (K−2), (K−1), (K+1), and (K+2)-th word lines are refreshed using the target address and information latched in the second latch unit if the activated word line is a K-th word line in the sections other than the target refresh section, and (L−1) and (L+1)-th redundancy word lines or (L−2), (L−1), (L+1), and (L+2)-th redundancy word lines are refreshed using the target address and the information if the activated word line is an L-th redundancy word line in the sections other than the target refresh section.

23. The memory device of claim 22, wherein the latch unit latches the operation address in a first refresh operation of the corresponding bank in the all-bank refresh section of the target refresh section and does not latch the operation address in operations other than the first refresh operation of the corresponding bank in the all-bank refresh section of the target refresh section.

24. The memory device of claim 22, wherein the all-bank refresh section comprises one or more of:

a section in which a per-bank refresh command is consecutively inputted by a number corresponding to a number of plurality of banks and all the plurality of banks are refreshed, wherein the per-bank refresh command selects one of the plurality of banks and refreshes the selected bank,
a section in which an all-bank refresh command is inputted and all the plurality of banks are refreshed, wherein the all-bank refresh command refreshes all the plurality of banks, and
a sum of a section in which a selected bank is refreshed in response to the per-bank refresh command if the all-bank refresh command has been applied before the per-bank refresh command is consecutively inputted by the number corresponding to the number of plurality of banks and a section in which the all-bank refresh command is inputted and all the plurality of banks are refreshed.

25. The memory device of claim 24, wherein if the address of the activated word line is a K-th word line of the bank in the sections other than the target refresh section, (K−1) and (K+2)-th word lines are refreshed if the target refresh section is a first target refresh section and (K−2), (K−1), (K+1), and (K+2)-th word lines are refreshed if the target refresh section is a second target refresh section.

26. The memory device of claim 25, wherein the address operation unit determines the operation value and one of the addition and the subtraction to be performed depending on that a currently executed refresh operation corresponds to any one of refresh operations in any one of the first and the second target refresh sections and a value of specific bits of the target address in the currently executed refresh operation.

27. The memory device of claim 25, wherein the address operation unit determines the operation value and one of the addition and the subtraction to be performed depending on that a currently executed refresh operation corresponds to any one of the refresh operations in any one of the first and the second target refresh sections and a value of specific bits of the target address in the currently executed refresh operation.

28. The memory device of claim 24, further comprising:
a refresh counting unit suitable for generating refresh counting information by performing counting when the all-bank refresh command is inputted or the per-bank refresh command is consecutively inputted by the number corresponding to the number of plurality of banks;
a target refresh control unit suitable for generating a target refresh section signal indicative of the target refresh section and one or more flag signals indicating that a currently executed refresh operation corresponds to any one of refresh operations of any one of a first and a second target refresh section with reference to the refresh counting information; and
a plurality of address selection units suitable for selecting one of the corresponding target address and an address latched in the corresponding second latch unit based on the flag signals and information latched in the corresponding second latch unit.

29. The memory device of claim 28, further comprising:
a plurality of hit signal generation units suitable for generating a plurality of hit signals corresponding to one or more of the plurality of redundancy word lines of the corresponding bank and activating one of the hit signals corresponding to one or more redundancy word lines that have repaired the one or more word lines corresponding to a repair address if the repair address is identical with an output address of the corresponding address selection unit;

a redundancy address control unit suitable for activating any one of a subtraction signal, a normal signal, and an addition signal based on specific bits of the output address of the corresponding address selection unit, the flag signals, and the information latched in the corresponding second latch unit has been repaired; and a plurality of redundancy address generation units suitable for generating a plurality of redundancy addresses corresponding to one of more of the plurality of redundancy word lines of the corresponding bank, activating one of the redundancy addresses corresponding an activated hit signal if the normal signal has been activated, activating one of redundancy addresses prior to the redundancy address corresponding to the activated hit signal if the subtraction signal has been activated, and activating one of the redundancy addresses subsequent to the redundancy address corresponding to the activated hit signal if the addition signal has been activated.

30. The memory device of claim 19, further comprising: an address counting unit suitable for generating a counting address by performing counting when the all-bank refresh command is inputted and the plurality of banks is refreshed or when the per-bank refresh command is consecutively inputted by the number corresponding to the number of plurality of banks and the plurality of banks is refreshed.

31. The memory device of claim 30, further comprising:
a plurality of word line control units each suitable for refreshing a word line that belongs to the plurality of word lines of the corresponding bank and that is selected using the counting address when the refresh operation is performed in the sections other than the target refresh section and refreshing one of the word lines selected using the target address in the target refresh section; and a plurality of redundancy word line control units suitable for refreshing a word line that belongs to the plurality of redundancy word lines of the corresponding bank and that is selected using specific bits of the output address of the corresponding address selection unit and the redundancy address of the corresponding redundancy address generation unit.

32. The memory device of claim 22, further comprising:
a control circuit configured to refresh one or more of the plurality of word lines corresponding to a counting address and to refresh the one or more of the plurality of word lines corresponding to a target address.

33. The memory device of claim 22, further comprising:
a target refresh control unit configured to control a target refresh operation.

34. The memory device of claim 22, wherein transfer signals and control signals are activated only once.

35. The memory device of claim 22, wherein flag signals are activated in response to the first refresh operation and a second refresh operation.

* * * * *